United States Patent
Kim et al.

(10) Patent No.: US 12,288,940 B2
(45) Date of Patent: Apr. 29, 2025

(54) POWER MODULE AND METHOD FOR MANUFACTURING SAME

(71) Applicant: AMOSENSE CO., LTD., Cheonan-si (KR)

(72) Inventors: Jonguk Kim, Cheonan-si (KR); Jinhyuck Bin, Cheonan-si (KR); Taeho Cho, Cheonan-si (KR); Seunggon Park, Cheonan-si (KR); Intae Yeo, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 255 days.

(21) Appl. No.: 17/925,293

(22) PCT Filed: May 11, 2021

(86) PCT No.: PCT/KR2021/005870
§ 371 (c)(1),
(2) Date: Nov. 14, 2022

(87) PCT Pub. No.: WO2021/230615
PCT Pub. Date: Nov. 18, 2021

(65) Prior Publication Data
US 2023/0178910 A1 Jun. 8, 2023

(30) Foreign Application Priority Data

| May 15, 2020 | (KR) | 10-2020-0058039 |
| May 15, 2020 | (KR) | 10-2020-0058042 |
| Jul. 2, 2020 | (KR) | 10-2020-0081490 |

(51) Int. Cl.
*H01L 23/00* (2006.01)
*H01L 23/373* (2006.01)
(Continued)

(52) U.S. Cl.
CPC ....... *H01R 12/523* (2013.01); *H01L 23/3735* (2013.01); *H01L 23/5385* (2013.01);
(Continued)

(58) Field of Classification Search
None
See application file for complete search history.

(56) References Cited

U.S. PATENT DOCUMENTS

| 6,376,782 B1 | 4/2002 | Kimura et al. |
| 9,634,407 B2 | 4/2017 | Endo et al. |

(Continued)

FOREIGN PATENT DOCUMENTS

| EP | 2 814 059 A1 | 12/2014 |
| JP | 2008-177307 A | 7/2008 |

(Continued)

OTHER PUBLICATIONS

Extended European Search Report dated Nov. 27, 2023 as received in Application No. 21804037.6.

*Primary Examiner* — Anthony Q Edwards
*Assistant Examiner* — Rashen E Morrison
(74) *Attorney, Agent, or Firm* — Maschoff Brennan

(57) ABSTRACT

The present invention relates to a power module and a method for manufacturing same, the power module comprising: a ceramic substrate including a ceramic base and an electrode pattern formed on the upper and lower surfaces of the ceramic base; a PCB substrate disposed above the ceramic substrate and including an electrode pattern; a plurality of through-holes formed in at least one of the ceramic substrate and the PCB substrate; and a connection pin coupled to the through-holes and connecting the electrode pattern of the ceramic substrate and the electrode pattern of the PCB substrate to each other. The present invention has advantages in that it is easy to fix the connection pin to the ceramic substrate, the position accuracy of the connection pin is improved, and the convenience of assembly is increased.

12 Claims, 15 Drawing Sheets

(51) Int. Cl.

| | |
|---|---|
| *H01L 23/538* | (2006.01) |
| *H01L 25/16* | (2023.01) |
| *H01R 4/02* | (2006.01) |
| *H01R 4/70* | (2006.01) |
| *H01R 12/52* | (2011.01) |
| *H01R 12/58* | (2011.01) |
| *H01R 43/02* | (2006.01) |

(52) U.S. Cl.
 CPC ........ *H01L 23/5386* (2013.01); *H01L 25/162* (2013.01); *H01R 4/02* (2013.01); *H01R 4/029* (2013.01); *H01R 4/70* (2013.01); *H01R 12/58* (2013.01); *H01R 43/0221* (2013.01); *H01R 43/0256* (2013.01)

(56) References Cited

U.S. PATENT DOCUMENTS

| | | | |
|---|---|---|---|
| 2011/0121448 | A1 | 5/2011 | Tsukada et al. |
| 2013/0084679 | A1 | 4/2013 | Stolze et al. |
| 2014/0110833 | A1 | 4/2014 | Yoo et al. |
| 2016/0141770 | A1* | 5/2016 | Hoehn .................... H01R 4/34 29/841 |

FOREIGN PATENT DOCUMENTS

| | | |
|---|---|---|
| KR | 10-2010-0104800 A | 9/2010 |
| KR | 10-2012-0047581 A | 5/2012 |
| KR | 10-2016-0045477 A | 4/2016 |
| KR | 10-2016-0068670 A | 6/2016 |

\* cited by examiner

[FIG. 1]
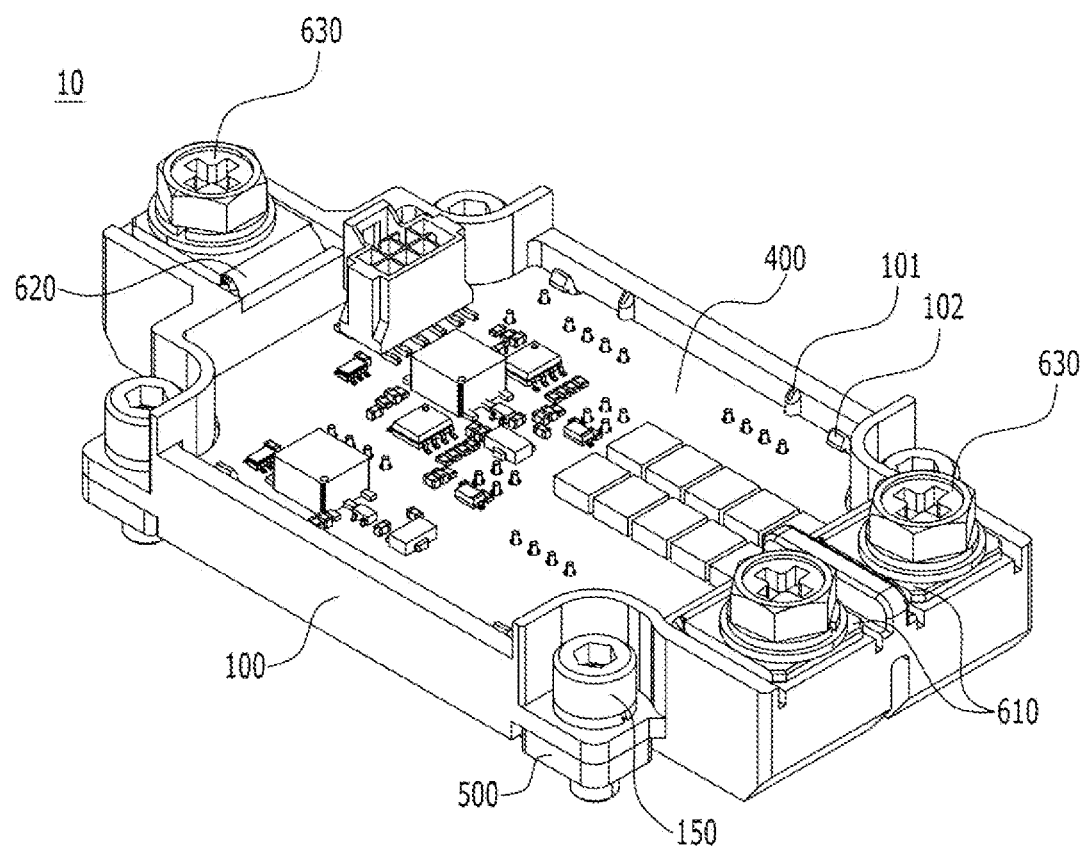

[FIG. 2]
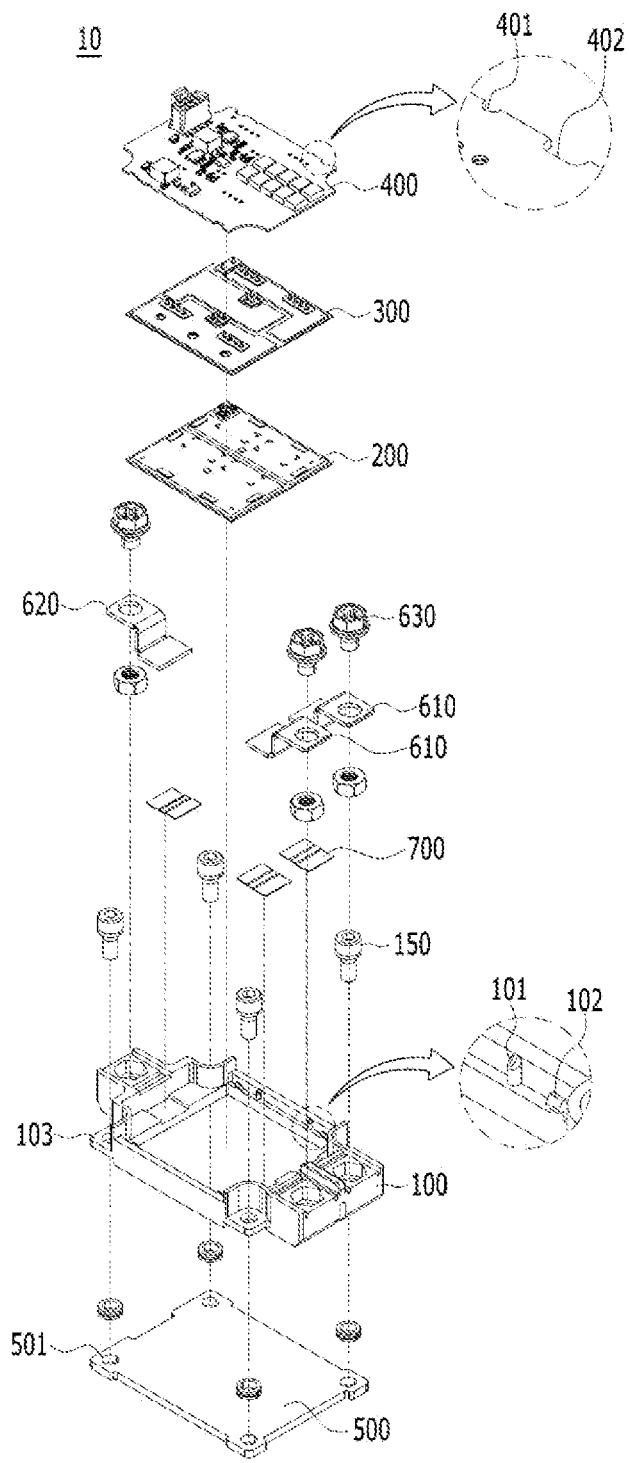

[FIG. 3]
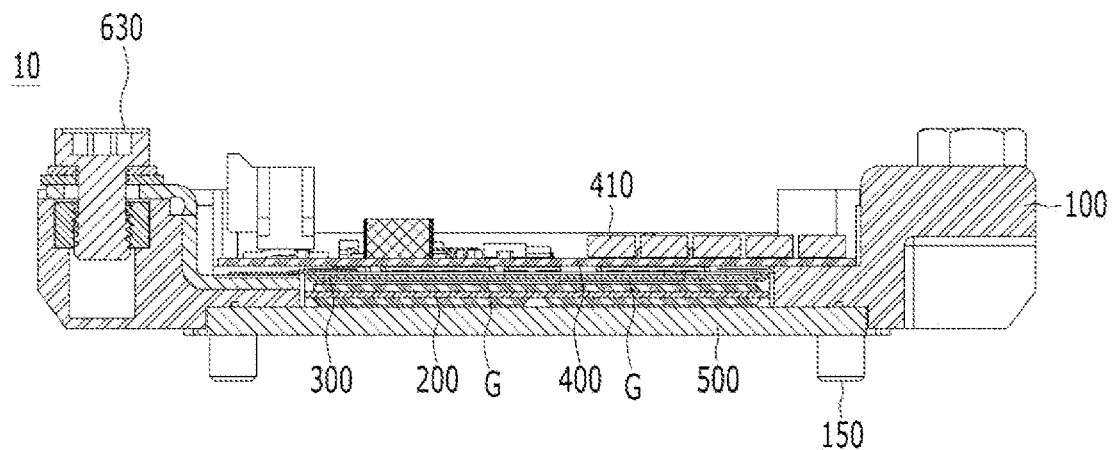
[FIG. 4]
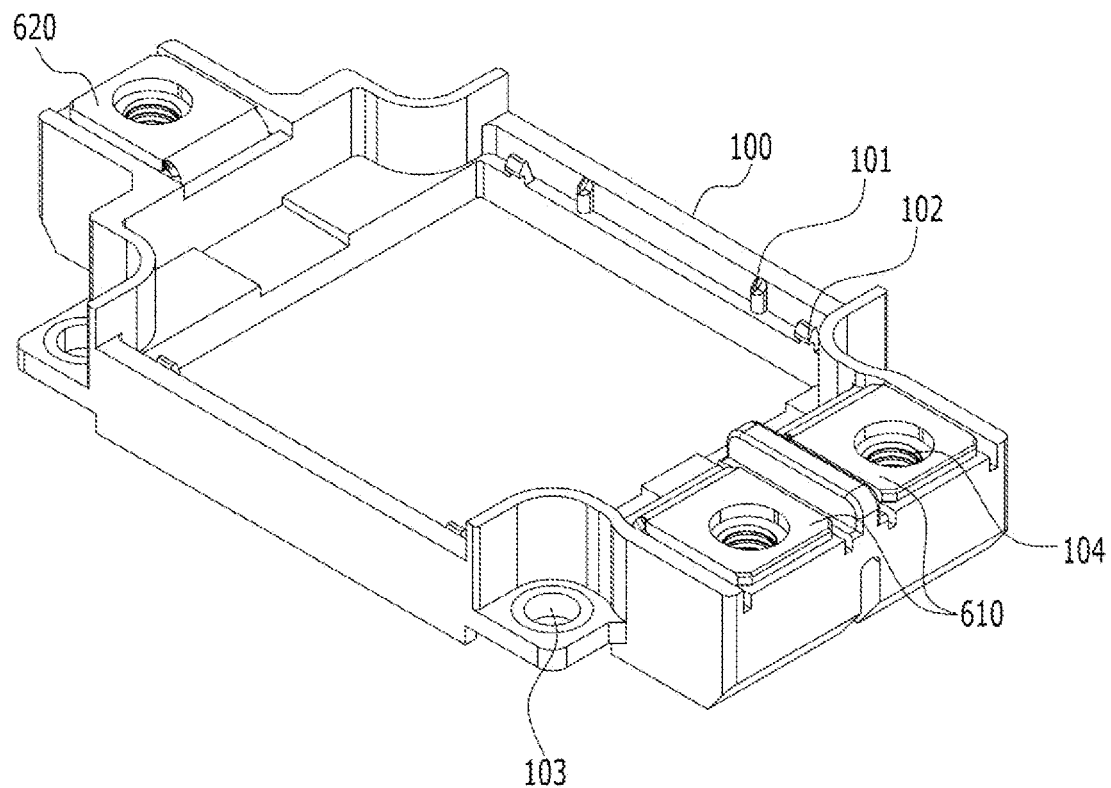

【FIG. 5】
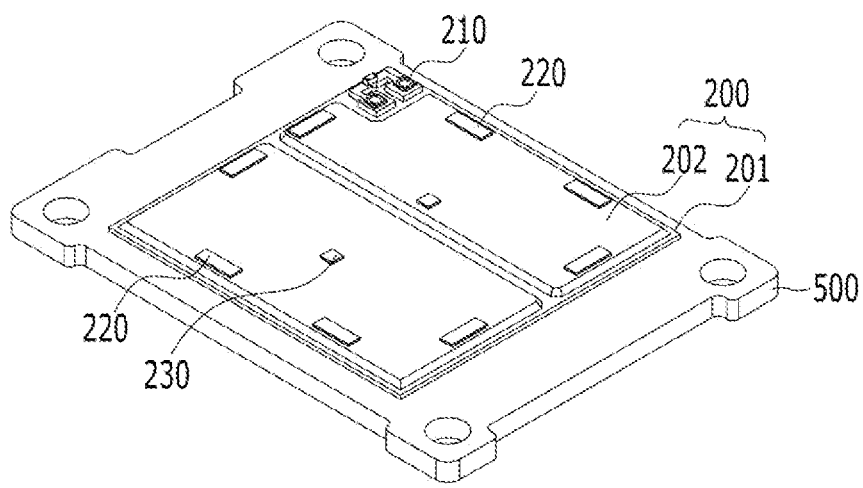
【FIG. 6】
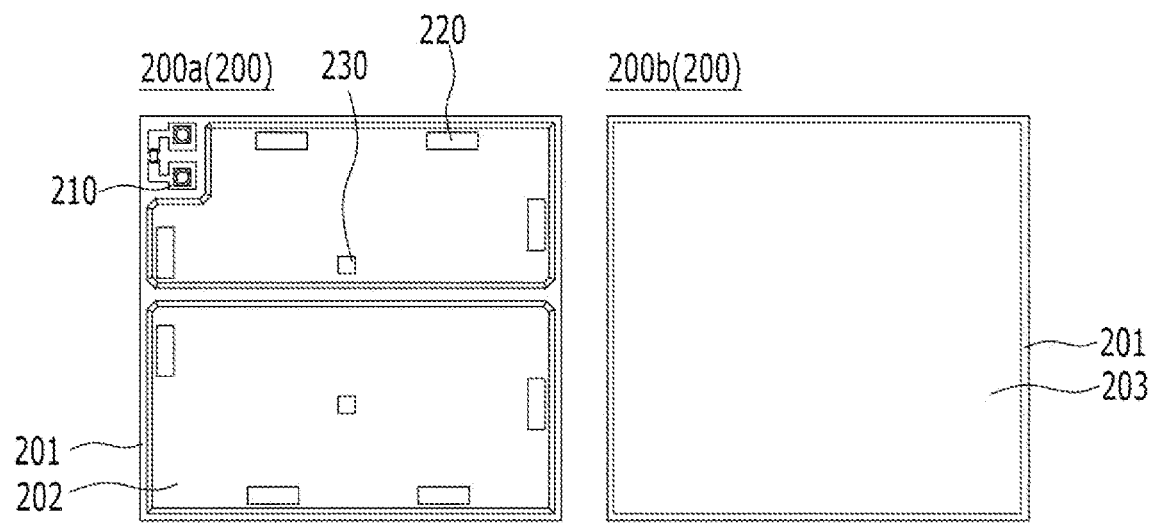

[FIG. 7]
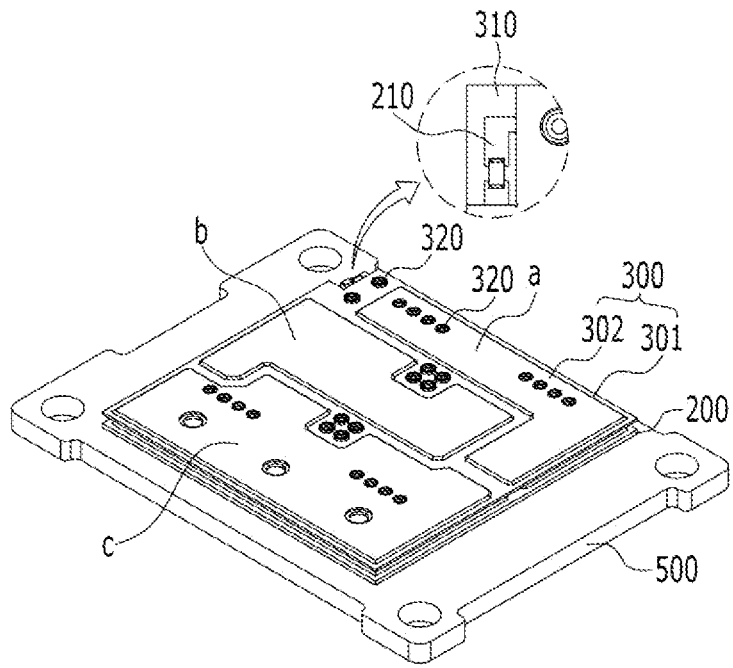
[FIG. 8]
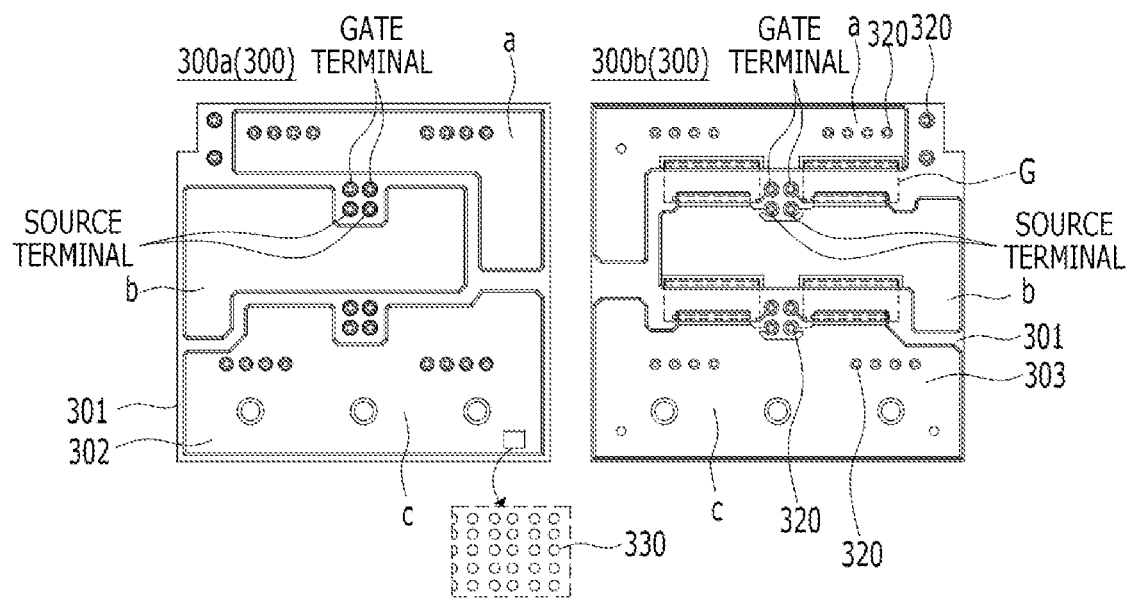

【FIG. 9】
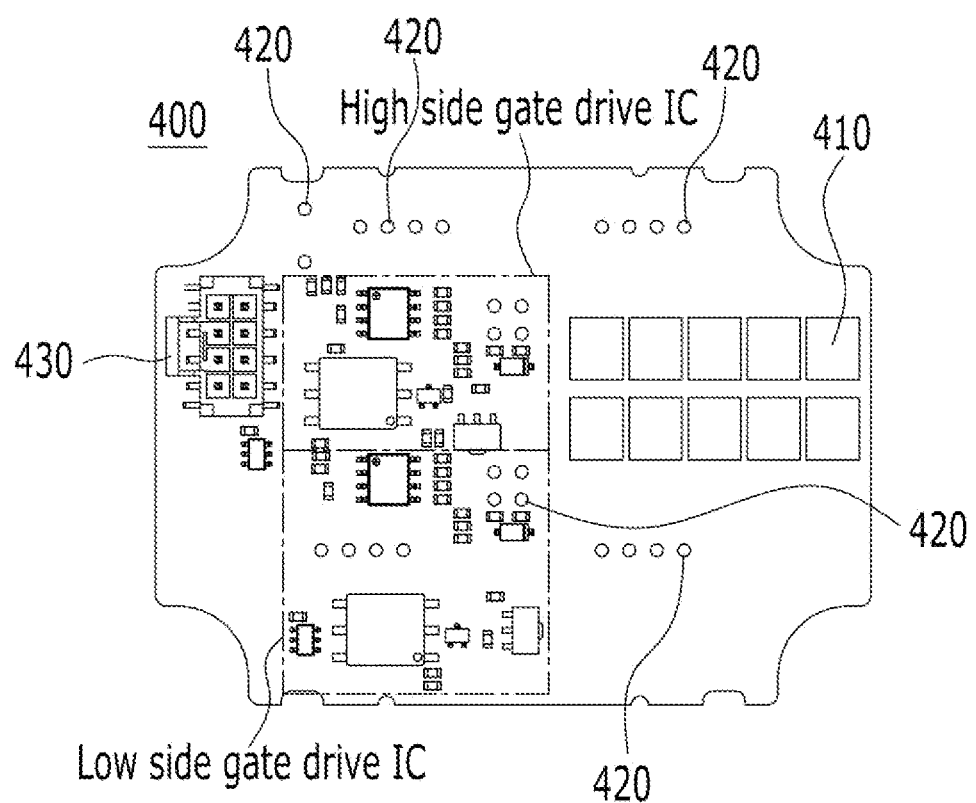

[FIG. 10]
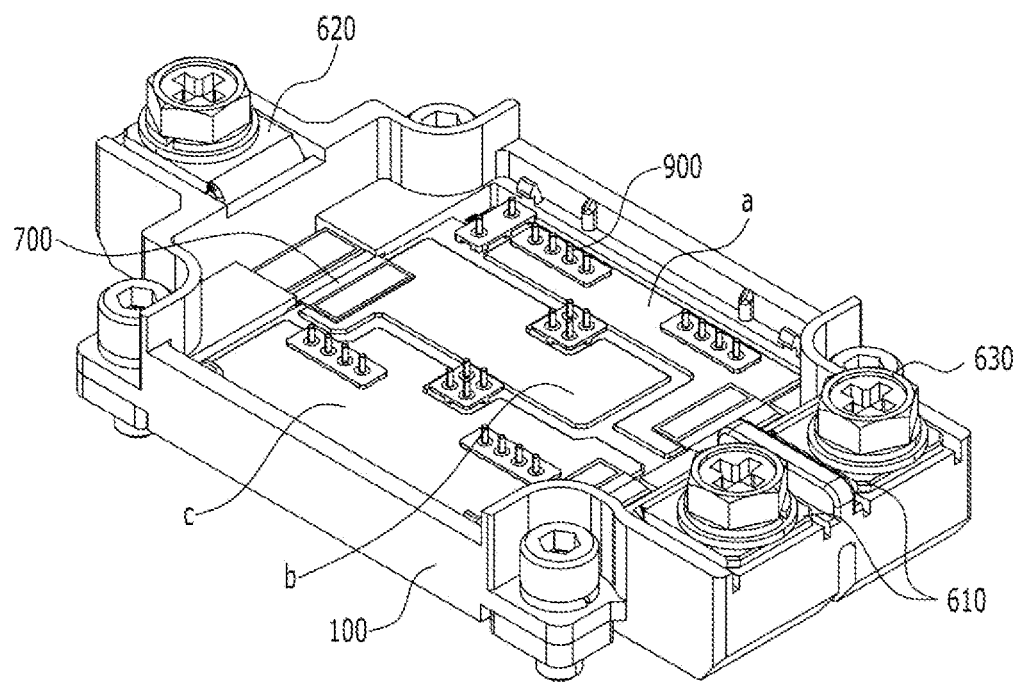
[FIG. 11]
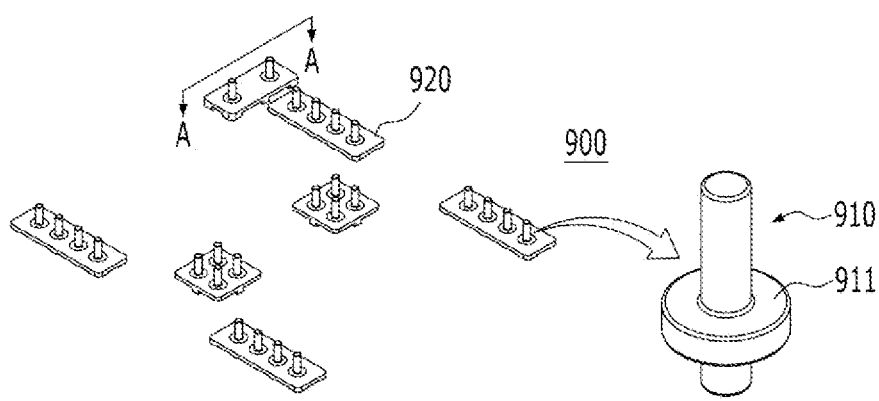

【FIG. 12】
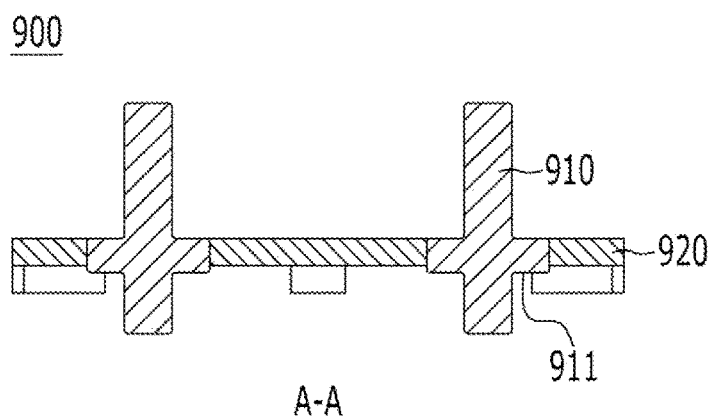
【FIG. 13】
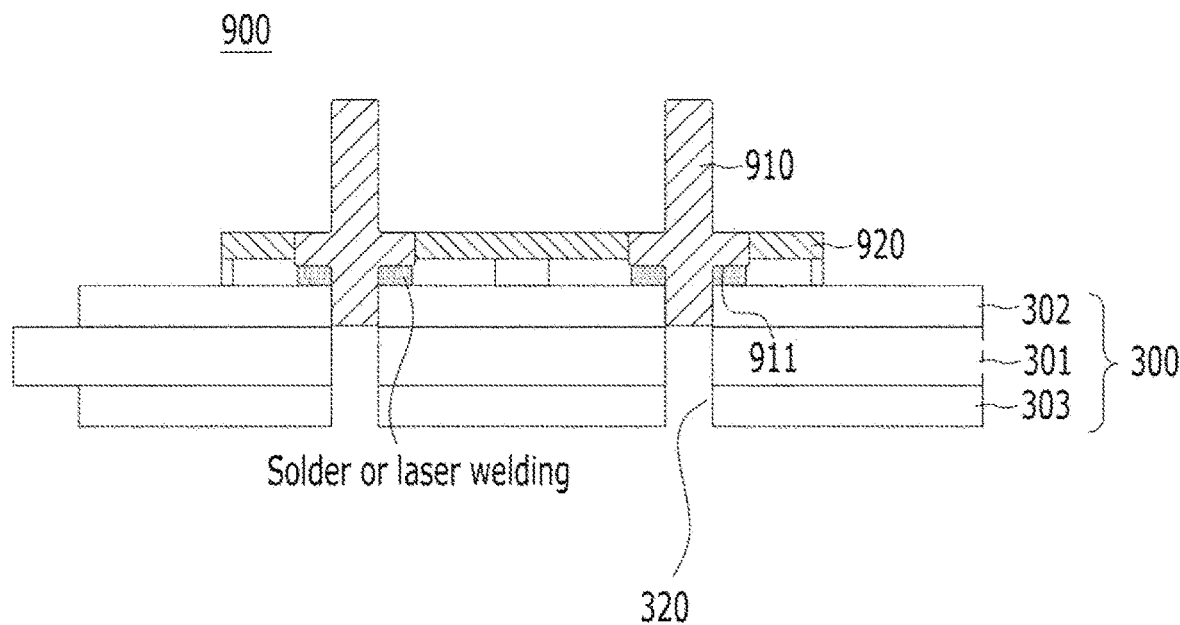

[FIG. 14]
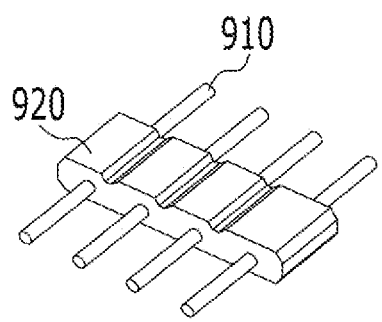
[FIG. 15]
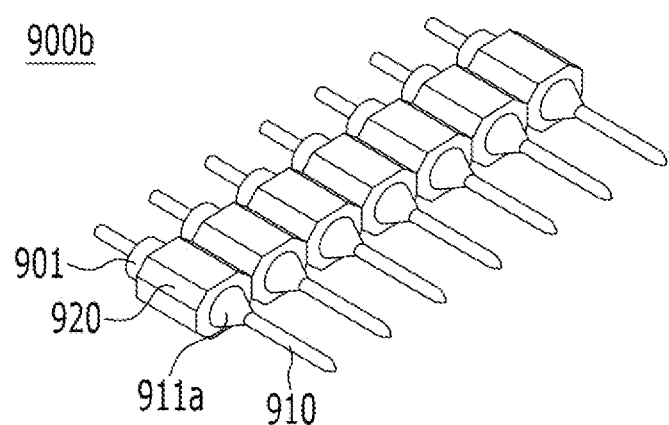

[FIG. 16]
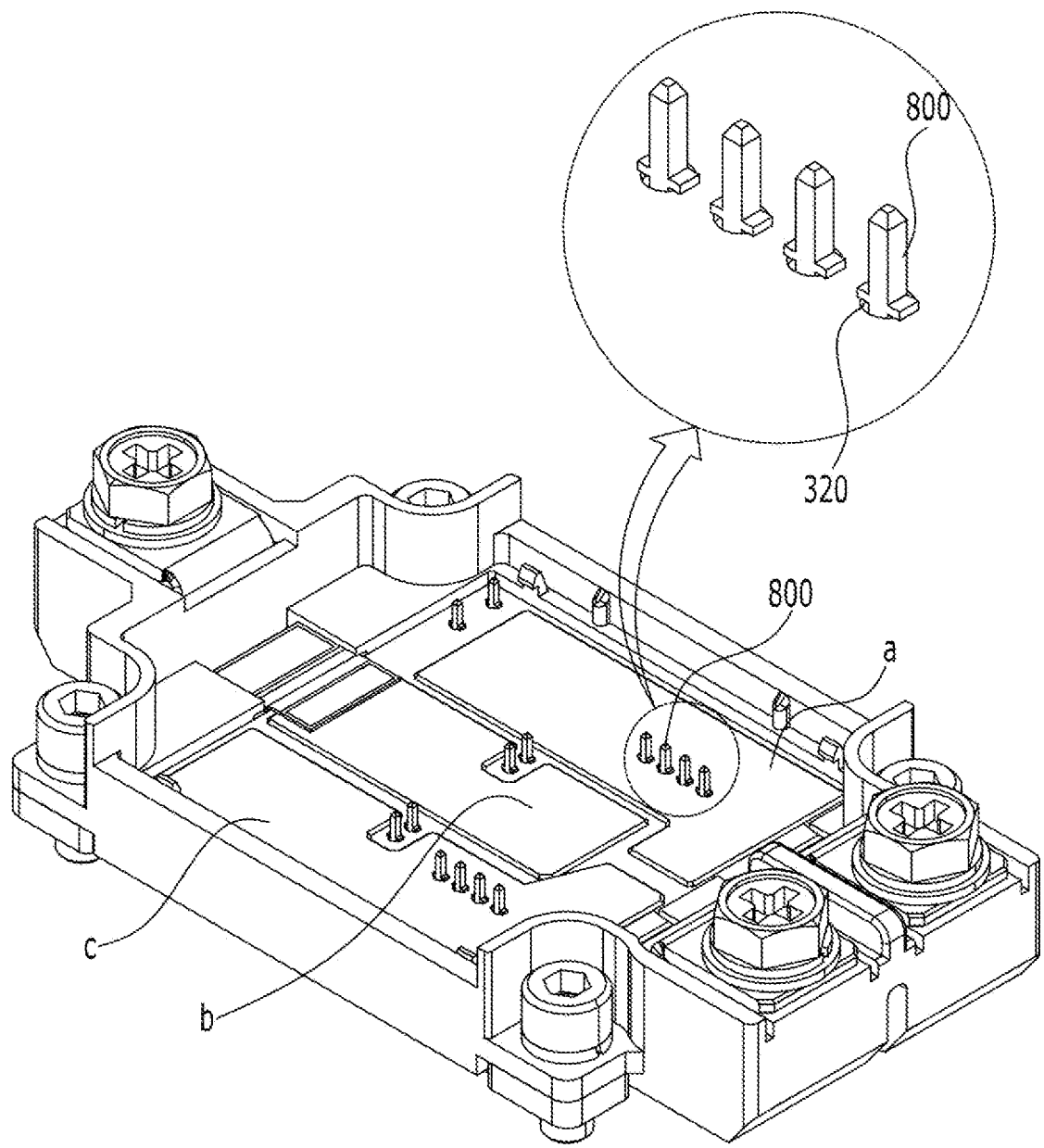

【FIG. 17】
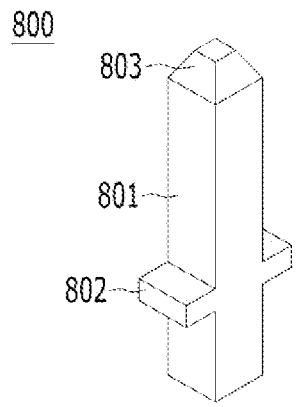
【FIG. 18】
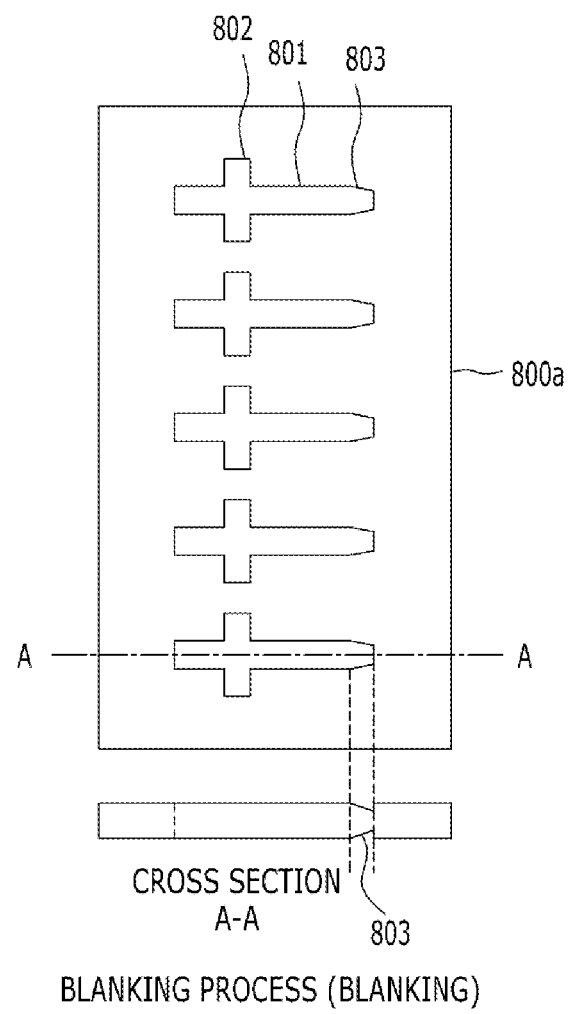
BLANKING PROCESS (BLANKING)

[FIG. 19]
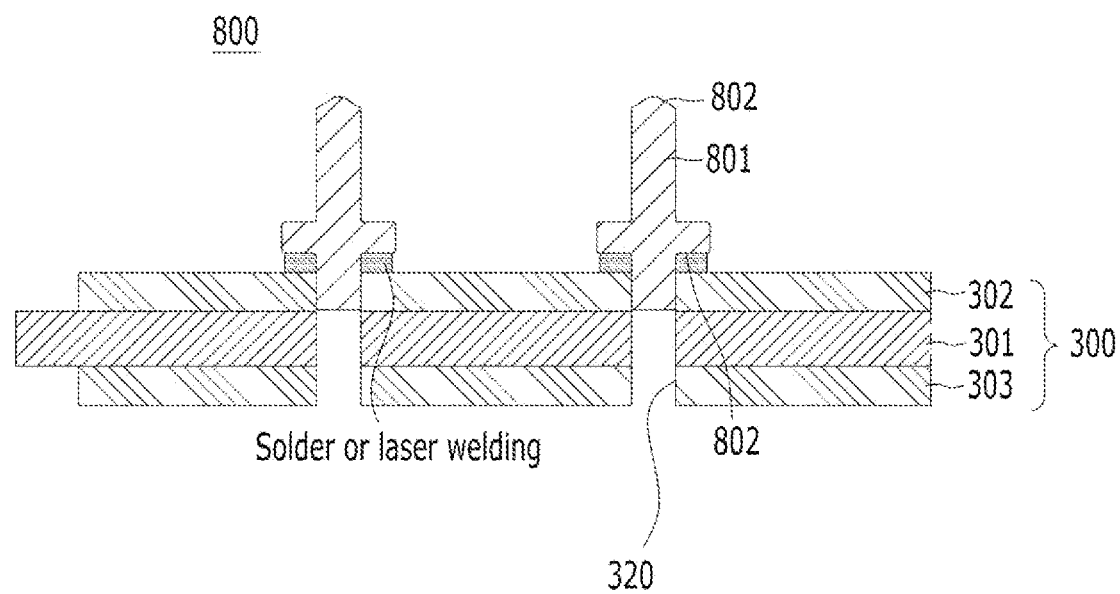
[FIG. 20]
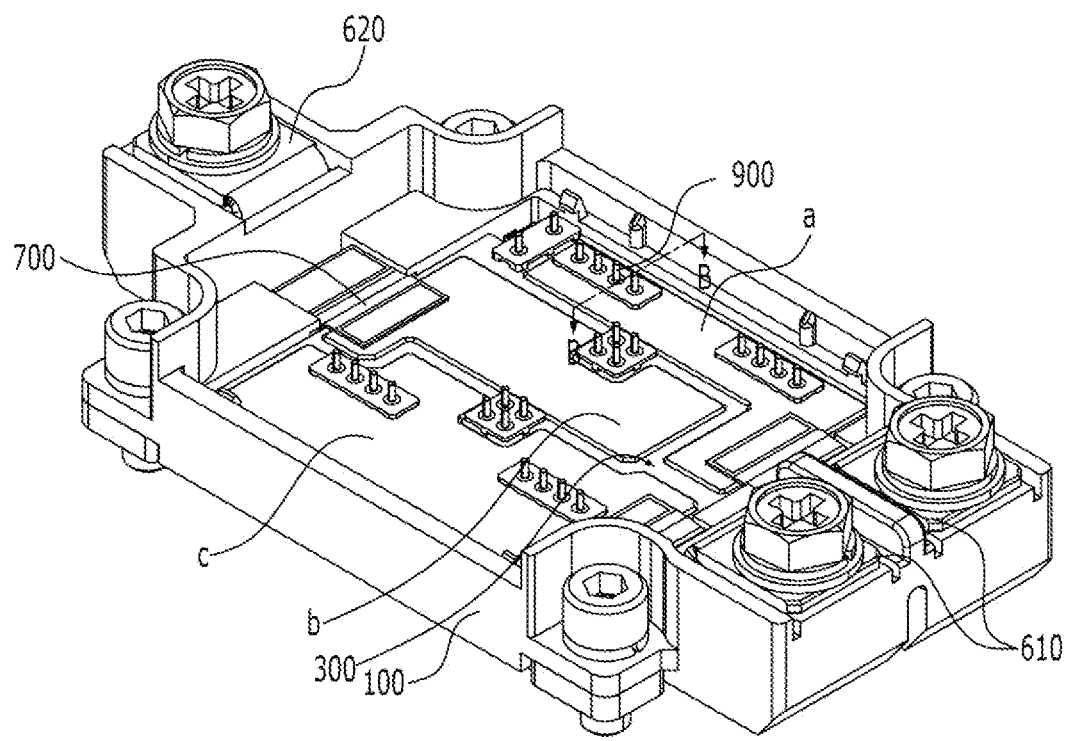

[FIG. 21]
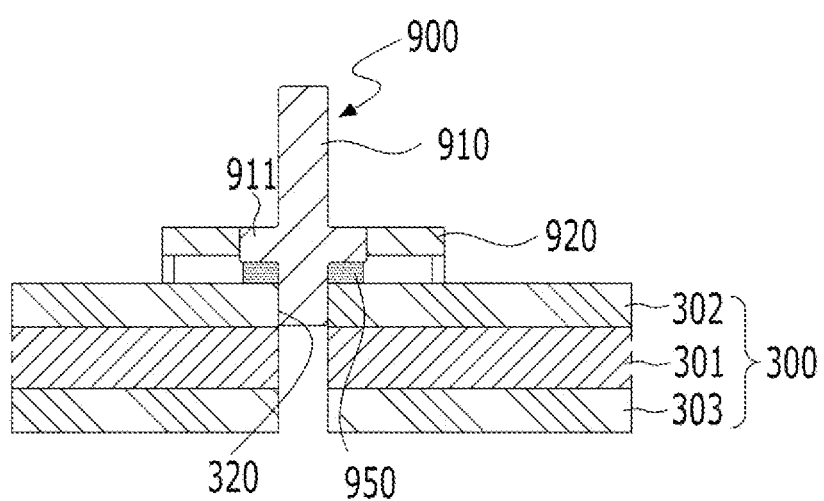

[FIG. 22]
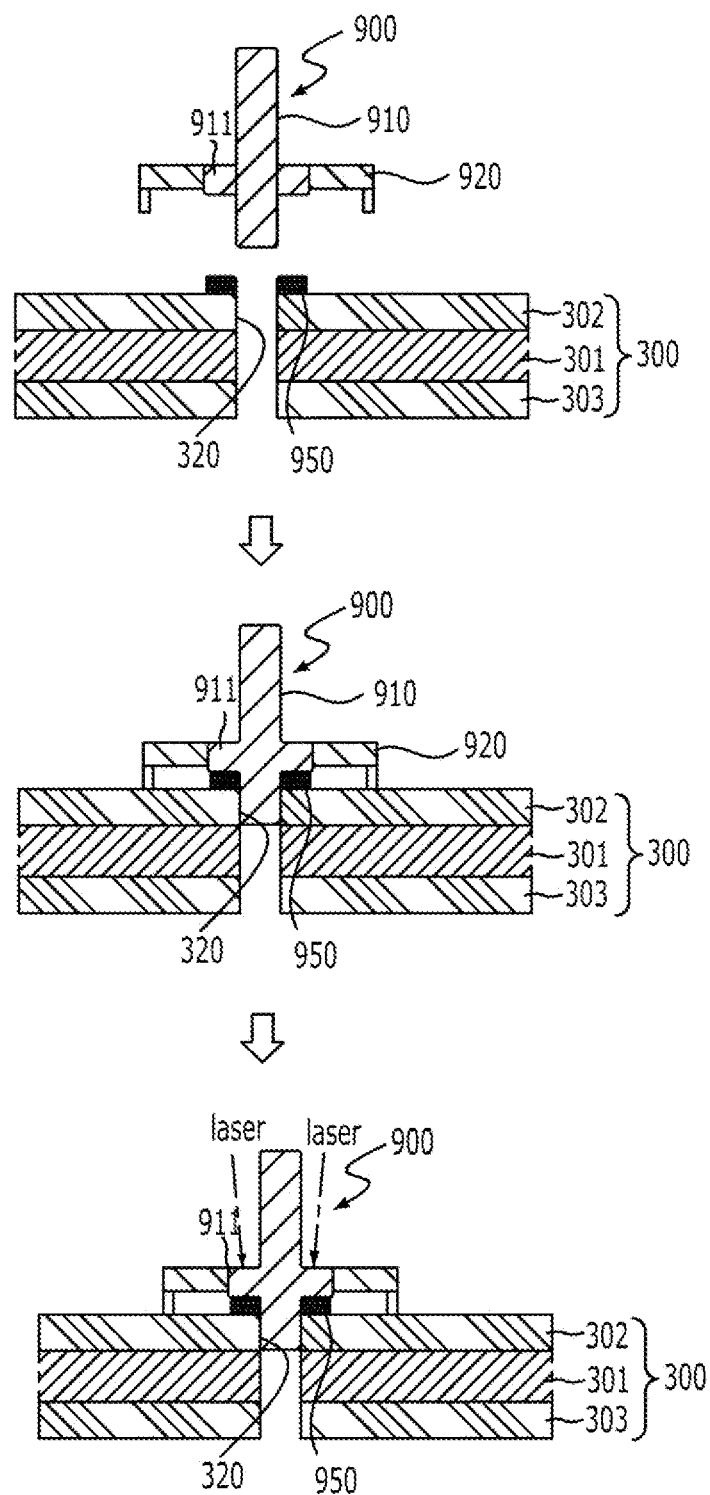

[FIG. 23]
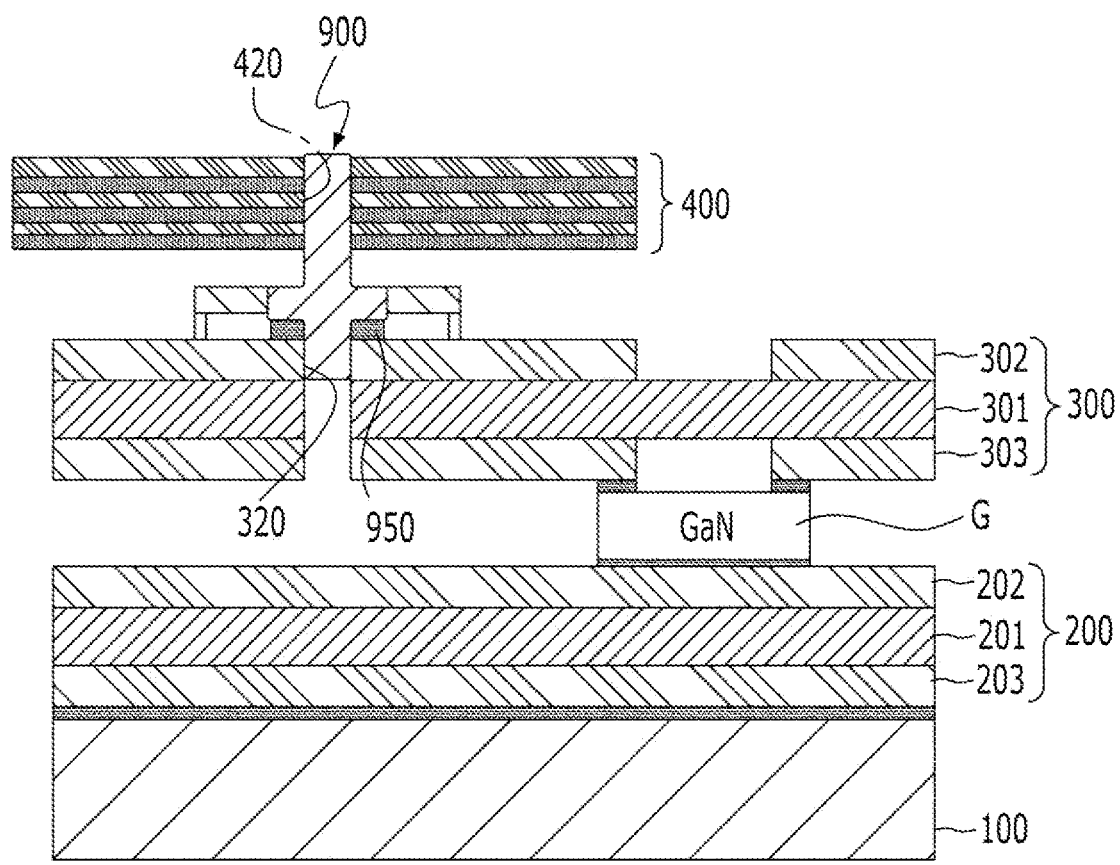

POWER MODULE AND METHOD FOR MANUFACTURING SAME

TECHNICAL FIELD

The present disclosure relates to a power module, and more particularly, to a power module having improved performance by applying a high-output power semiconductor chip and a method of manufacturing the same.

BACKGROUND ART

A power module is used to supply a high voltage and current in order to drive a motor in a hybrid vehicle or an electric vehicle.

A double-sided cooling power module among the power modules has substrates installed on and below a semiconductor chip, respectively, and has heat sinks provided on the outsides of the substrates, respectively. The use of the double-sided cooling power module tends to be gradually increased because the double-sided cooling power module has more excellent cooling performance than a cross-section cooling power module having a heat sink provided on one side thereof.

The double-sided cooling power module that is used in an electric vehicle, etc. generates high heat due to a high voltage and vibration during driving because a power semiconductor chip made of silicon carbide (SiC), gallium nitride (GaN), etc. is mounted between the two substrates. In order to solve such a problem, it is important to satisfy both high strength and high heat dissipation characteristics.

DISCLOSURE

Technical Problem

An object of the present disclosure is to provide a power module which has high strength and high heat dissipation characteristics and has an excellent bonding characteristic and which can reduce a volume by minimizing a current path and can improve efficiency and performance.

Another object of the present disclosure is to provide a power module which has increased location accuracy of a connection pin and has increased assembly convenience by fabricating the connection pin coupled to a through hole in a bundle form and coupling the connection pin to the through hole by fitting.

Still another object of the present disclosure is to provide a power module capable of reducing a manufacturing unit price by fabricating the connection pin coupled to the through hole in a shape capable of mass production.

Still another object of the present disclosure is to provide a power module which enables the connection pin to be easily fixed to a ceramic substrate and increases location accuracy of the connection pin, and a method of manufacturing the same.

Technical Solution

According to a characteristic of the present disclosure for achieving the object, the present disclosure includes a ceramic substrate including a ceramic base and electrode patterns formed at an upper surface and a lower surface of the ceramic base, a PCB substrate disposed over the ceramic substrate and including an electrode pattern, a plurality of through holes formed in at least one of the ceramic substrate and the PCB substrate, and a connection pin coupled to the through hole and connecting the electrode patterns of the ceramic substrate and the electrode pattern of the PCB substrate.

The connection pin may be a bundle type connection pin in which a plurality of connection pins is interconnected at regular intervals.

The bundle type connection pin may include a plurality of connection pins each having a cylindrical shape and having a circular wing part formed on an outer circumference thereof, and a plastic structure matched with the plurality of connection pins in shape or subjected to insert injection with the plurality of connection pins so that the plurality of connection pins is spaced apart from each other in a way to correspond to an interval between the through holes.

The bundle type connection pin may have the plastic structure matched with the wing part in shape or may have the plastic structure subjected to insert injection with the wing part, and a part of the wing part may protrude from the lower surface of the plastic structure.

The connection pin may be a bundle type connection pin having a 2×2 pin or 2×1 pin or 4×1 pin structure or a bundle type connection pin having a structure in which the plurality of connection pins is aligned in a row.

The connection pin may be fit and coupled to the through hole and may be soldered and bonded to an edge of the through hole.

The connection pin may be formed of copper or a copper alloy.

The connection pin may include a pin body formed in a quadrangle column shape and wings formed on both sides of the pin body in a way to protrude and each having a quadrangle shape.

The connection pin may be formed by blanking a metal plate.

The top of the connection pin may be formed in a quadrangle pyramid shape, and the metal plate may have a shape including pressurization parts formed at an upper surface and a lower surface thereof by pressurizing the metal plate in a way to correspond to the quadrangle pyramid shape.

The length of a diagonal line of a cross section of the pin body of the connection pin may correspond to an inner diameter of the through hole.

The through hole may have a shape corresponding to a shape of a cross section of the connection pin.

The pin body of the connection pin may be fit and coupled to the through hole, and the wings of the connection pin may be soldered and bonded to an edge of the through hole.

The connection pin may be fit and coupled to the through hole and may be bonded to a metal layer forming the electrode pattern of the ceramic substrate by laser welding.

The connection pin may include a pin body formed in a circular or quadrangle column shape, and wing parts formed on an outer circumference of the pin body or on both sides thereof in a way to protrude and may be seated in the metal layer at the edge of the through hole.

The power module may further include a solder layer disposed and bonded between the metal layer at the edge of the through hole and the connection pin.

The connection pin and the metal layer may be formed of copper or a copper alloy.

A method of manufacturing a power module includes preparing a ceramic substrate including a ceramic base and metal layers including at an upper surface and a lower surface of the ceramic base, forming a through hole so that the through hole penetrates the metal layers of the ceramic substrate and the ceramic base, fitting and coupling a connection pin to the through hole, and bonding the connection pin to the metal layers of the ceramic substrate by radiating a laser to the connection pin fit and coupled to the through hole.

The method may further include coating the through hole and an edge of the through hole with a solder before performing fitting and coupling the connection pin to the through hole.

The laser may heat the connection pin at a temperature of 700° C. or more.

Advantageous Effects

The present disclosure has effects in that it has high strength and high heat dissipation characteristics and has an excellent bonding characteristic, can reduce a volume by minimizing a current path, and can improve efficiency and performance due to optimization for high-speed switching.

Furthermore, the present disclosure has effect in that the connection pin can be easily fixed and the precision of a location thereof is improved because the connection pin is fixed by forming the through hole in the upper ceramic substrate.

Furthermore, the present disclosure has effects in that it can increase location accuracy of the connection pin coupled to the through hole by fitting, increase operation reliability of the power module, and increase work convenience in a process of manufacturing the power module through improved assembly convenience because the connection pin coupled to the through hole is manufactured as a bundle type connection pin and coupled to the plurality of through holes at a time.

Furthermore, the present disclosure has effects in that a manufacturing unit price can be reduced and work convenience in a process of manufacturing a power module can be increased because the connection pin coupled to the through hole is formed in a shape capable of mass production and mass production is made possible through a blanking process.

Furthermore, the present disclosure has effects in that the connection pin can be easily fixed to the upper ceramic substrate and the precision of a location thereof is improved because the through hole is formed in the upper ceramic substrate and coupled to the connection pin and the connection pin and the metal layer of the upper ceramic substrate are bonded by using a laser welding method, and it is advantageous in securing operational reliability of the power module because the connection pin is stably connected to the metal layer of the upper ceramic substrate.

DESCRIPTION OF DRAWINGS

FIG. 1 is a perspective view of a power module according to an embodiment of the present disclosure.

FIG. 2 is an exploded perspective view of the power module according to an embodiment of the present disclosure.

FIG. 3 is a side cross-sectional view of the power module according to an embodiment of the present disclosure.

FIG. 4 is a perspective view illustrating a housing according to an embodiment of the present disclosure.

FIG. 5 is a perspective view illustrating a lower ceramic substrate according to an embodiment of the present disclosure.

FIG. 6 is a diagram illustrating the upper surface and the lower surface of the lower ceramic substrate according to an embodiment of the present disclosure.

FIG. 7 is a perspective view illustrating an upper ceramic substrate according to an embodiment of the present disclosure.

FIG. 8 is a diagram illustrating the upper surface and the lower surface of the upper ceramic substrate according to an embodiment of the present disclosure.

FIG. 9 is a plan view of a PCB substrate according to an embodiment of the present disclosure.

FIG. 10 is a perspective view illustrating the state in which pin connections have been coupled to the upper ceramic substrate according to an embodiment of the present disclosure.

FIG. 11 is a perspective view illustrating a bundle type connection pin according to an embodiment of the present disclosure.

FIG. 12 is a diagram of a cross section A-A in FIG. 11.

FIG. 13 is a cross-sectional view illustrating a form in which the bundle type connection pin in FIG. 12 has been coupled to the upper ceramic substrate.

FIGS. 14 and 15 are perspective views illustrating modified examples of the bundle type connection pin according to an embodiment of the present disclosure.

FIG. 16 is a perspective view illustrating the state in which connection pins have been coupled to an upper ceramic substrate according to another embodiment of the present disclosure.

FIG. 17 is a perspective view illustrating a connection pin according to another embodiment of the present disclosure.

FIG. 18 is a plan view and side cross-sectional view illustrating a method of a connection pin according to another embodiment of the present disclosure.

FIG. 19 is a cross-sectional view illustrating a form in which the connection pins in FIG. 17 have been coupled to the upper ceramic substrate.

FIG. 20 is a perspective view illustrating the state in which a connection pin has been coupled to an upper ceramic substrate according to still another embodiment of the present disclosure.

FIG. 21 is a diagram illustrating the state in which the connection pin has been coupled to a through hole as still another embodiment of the present disclosure.

FIG. 22 is a diagram for describing a process of fixing the connection pin to the through hole as still another embodiment of the present disclosure.

FIG. 23 is a partial cross-sectional view illustrating the state in which the connection pin has been fixed to the through hole of the upper ceramic substrate and the PCB substrate has been installed on the connection pin as still another embodiment of the present disclosure.

| *Description of reference numerals* | |
|---|---|
| 10: power module | 100: housing |
| 101: guide rib | 102: locking projection |
| 103: fastening hole | 104: support hole |
| 200: lower ceramic substrate | 201: ceramic base |
| 202, 203: metal layer | 210: NTC temperature sensor |
| 220: insulating spacer | 230: interconnection spacer |
| 300: upper ceramic substrate | 301: ceramic base |
| 302, 302: metal layer | 310: cutting part |
| 320, 420: through hole | 330: via hole |
| 400: PCB substrate | 401: guide groove |
| 410: capacitor | 420: through hole |
| 500: heat sink | 501: communication hole |
| 610: first terminal | 620: second terminal |
| 630: support bolt | 700: bus bar |
| G: semiconductor chip (GaN chip) | 800: connection pin |
| 801: pin body | 802: wing |

-continued

*Description of reference numerals*

| | |
|---|---|
| 803 : top | 800a: metal plate |
| 803a: pressurization part | 900: bundle type connection pin, connection pin |
| 910: connection pin, the pin body | 911: wing part |
| 920: plastic structure | 950: solder layer |

BEST MODE

Hereinafter, embodiments of the present disclosure are described in detail with reference to the accompanying drawings.

FIG. 1 is a perspective view of a power module according to an embodiment of the present disclosure. FIG. 2 is an exploded perspective view of the power module according to an embodiment of the present disclosure.

As illustrated in FIGS. 1 and 2, the power module 10 according to an embodiment of the present disclosure is an electronic part having a package form, which is formed by accommodating, in a housing 100, various components that form the power module. The power module 10 is formed in a form in which substrates and elements are disposed and protected within the housing 100.

The power module 10 may include multiple substrates and multiple semiconductor chips. The power module 10 according to an embodiment includes the housing 100, a lower ceramic substrate 200, an upper ceramic substrate 300, a PCB substrate 400, and a heat sink 500.

An empty space that is opened up and down is formed at the center of the housing 100. First terminals 610 and a second terminal 620 are disposed on both sides of the housing 100. The heat sink 500, the lower ceramic substrate 200, the upper ceramic substrate 300, and the PCB substrate 400 are sequentially stacked in the empty space at the center of the housing 100 at regular intervals. Support bolts 630 for connecting external terminals are fastened to the first terminals 610 and the second terminal 620 on both sides of the housing 100. The first terminals 610 and the second terminal 620 are used as the input and output stages of a power source.

As illustrated in FIG. 2, in the power module 10, the lower ceramic substrate 200, the upper ceramic substrate 300, and the PCB substrate 400 are sequentially accommodated in the empty space at the center of the housing 100. Specifically, the heat sink 500 is disposed at the lower surface of the housing 100. The lower ceramic substrate 200 is attached to the upper surface of the heat sink 500. The upper ceramic substrate 300 is disposed over the lower ceramic substrate 200 at a regular interval. The PCB substrate 400 is disposed over the upper ceramic substrate 300 at a regular interval.

The state in which the PCB substrate 400 has been disposed in the housing 100 may be fixed by guide grooves 401 and 402 formed at an edge of the PCB substrate 400 in a way to be concaved and a guide rib 101 and a locking projection 102 that are formed in the housing 100 in a way to correspond to the guide grooves 401 and 402. The multiple guide grooves 401 and 402 are formed to enclose the edge of the PCB substrate 400 according to an embodiment. The guide rib 101 formed on the inner surface of the housing 100 is guided through some guide grooves 401 of the multiple guide grooves 401 and 402. The locking projection 102 formed on the inner surface of the housing 100 passes through the remaining some guide grooves 402 of the multiple guide grooves 401 and 402, and is hung thereto.

Alternatively, the state in which the heat sink 500, the lower ceramic substrate 200, and the upper ceramic substrate 300 are accommodated in the empty space at the center of the housing 100 and the PCB substrate 400 is disposed at the upper surface thereof may also be fixed by a fastening bolt (not illustrated). However, fixing the PCB substrate 400 to the housing 100 through the guide groove and the locking projection structure reduces an assembly time and has a simple assembly process compared to a case in which the PCB substrate 400 is fixed to the housing 100 by the fastening bolt.

Fastening holes 103 are formed at four corners of the housing 100. The fastening holes 103 communicate with the communication holes 501 formed in the heat sink 500. Fixing bolts 150 are fastened to penetrate the fastening holes 103 and the communication holes 501. The ends of the fixing bolts 150 that have penetrated the fastening holes 103 and the communication holes 501 may be fastened to fixing holes of a fixing jig to be disposed at the lower surface of the heat sink 500.

Bus bars 700 are connected to the first terminals 610 and the second terminal 620. The bus bars 700 connect the first terminals 610 and the second terminal 620 to the upper ceramic substrate 300. Three bus bars 700 are provided. One of the bus bars 700 connects a + terminal, among the first terminals 610, to a first electrode pattern a of the upper ceramic substrate 300, and another of the bus bars 700 connects a − terminal, among the first terminals 610, to a third electrode pattern c. The remainder of the bus bars 700 connects the second terminal 620 to a second electrode pattern b. For the first electrode pattern a, the second electrode pattern b, and the third electrode pattern c, reference is made to FIGS. 7 and 10 to be described later.

FIG. 3 is a side cross-sectional view of the power module according to an embodiment of the present disclosure.

As illustrated in FIG. 3, the power module 10 is a duplex structure of the lower ceramic substrate 200 and the upper ceramic substrate 300. A semiconductor chip G is disposed between the lower ceramic substrate 200 and the upper ceramic substrate 300. The semiconductor chip G may be any one of a gallium nitride (GaN) chip, a metal oxide semiconductor field effect transistor (MOSFET), an insulated gate bipolar transistor (IGBT), a junction field effect transistor (JFET), and a high electric mobility transistor (HEMT), but the GaN chip is preferably used as the semiconductor chip G. The gallium nitride (GaN) chip G is a semiconductor chip that functions as a high power (300 A) switch and a high-speed (~1 MHz) switch. The GaN chip has advantages in that it is more resistant to heat than the existing silicon-based semiconductor chip and can also reduce the size of the chip.

Each of the lower ceramic substrate 200 and the upper ceramic substrate 300 is formed of a ceramic substrate including a ceramic base and a metal layer brazing-bonded to at least one surface of the ceramic base so that heat dissipation efficiency of heat generated from the semiconductor chip G can be increased.

The ceramic base may be any one of alumina ($Al_2O_3$), AlN, SiN, and $Si_3N_4$, for example. The metal layer is a metal foil brazing-bonded to a surface of the ceramic base, and is formed in the form of an electrode pattern on which the semiconductor chip G is mounted and an electrode pattern on which a driving element is mounted. For example, the metal layer is formed in the form of an electrode pattern in an area on which a semiconductor chip or a peripheral part will be mounted. The metal foil is an aluminum foil or a copper foil, for example. The metal foil is sintered on the ceramic base at 780° C. to 1100° C. and brazing-bonded to the ceramic base, for example. Such a ceramic substrate is called an AMB substrate. An embodiment is described by taking the AMB substrate as an example, but may apply a DBC substrate, a TPC substrate, or a DBA substrate. However, in terms of durability and heat dissipation efficiency, the AMB substrate is most appropriate. For the reason, the lower ceramic substrate 200 and the upper ceramic substrate 300 are AMB substrates, for example.

The PCB substrate 400 is disposed over the upper ceramic substrate 300. That is, the power module 10 is constituted with a three-layer structure of the lower ceramic substrate 200, the upper ceramic substrate 300, and the PCB substrate 400. Heat dissipation efficiency is increased by disposing the semiconductor chip G for control for high power between the upper ceramic substrate 300 and the lower ceramic substrate 200. Damage to the PCB substrate 400 attributable to heat which occurs in the semiconductor chip G is prevented by disposing the PCB substrate 400 for control for low power at the top of the power module 10. The lower ceramic substrate 200, the upper ceramic substrate 300, and the PCB substrate 400 may be connected or fixed by pins.

The heat sink 500 is disposed under the lower ceramic substrate 200. The heat sink 500 is for discharging heat that is generated from the semiconductor chip G. The heat sink 500 is formed in a quadrangle plate shape having a predetermined thickness. The heat sink 500 is formed to have an area corresponding to the housing 100, and may be formed of a copper or aluminum material in order to increase heat dissipation efficiency.

Hereinafter, characteristics for each component of the power module of the present disclosure are more specifically described. In a drawing that describes the characteristics for each component of the power module, there is a portion that has been expressed by enlarging or exaggerating the drawing in order to highlight the characteristics of each component. Accordingly, a portion that is not partially identical with some of the basic drawing illustrated in FIG. 1 may be present.

FIG. 4 is a perspective view illustrating a housing according to an embodiment of the present disclosure.

As illustrated in FIG. 4, the housing 100 has an empty space formed at the center thereof, and has the first terminals 610 and the second terminal 620 disposed at both ends thereof. The housing 100 may have the first terminals 610 and the second terminal 620 formed at both ends thereof by using an insert injection method in a way to be integrally fixed thereto.

In the existing power module, a connection pin is applied to the housing through insert injection in order to connect isolated circuits. In contrast, in the present embodiment, the housing 100 has a shape that is manufactured by excluding the connection pin upon manufacturing. This improves flexibility for torsion moment of the power module by simplifying a shape of the power module because the connection pin is not disposed within the housing 100.

The housing 100 has the fastening holes 103 formed at the four corners thereof. The fastening holes 103 communicate with the communication holes 501 formed in the heat sink 500. The first terminals 610 and the second terminal 620 have support holes 104 formed therein. The support bolts 630 for connecting the first terminals 610 and the second terminal 620 to external terminals, such as a motor, are fastened to support bolts 630 (refer to FIG. 10).

The housing 100 is formed of an insulating material. The housing 100 may be formed of an insulating material so that heat generated from the semiconductor chip G is not delivered to the PCB substrate 400 over the housing 100, through the housing 100.

Alternatively, a heat dissipation plastic material may be applied to the housing 100. The heat dissipation plastic material may be applied to the housing 100 so that heat generated from the semiconductor chip G can be discharged to the outside through the housing 100. For example, the housing 100 may be formed of engineering plastics. The engineering plastics has high heat resistance, excellent strength, chemical resistance, and wear resistance, and may be used for a long time at 150° C. or more. The engineering plastics may be made of one material among polyamide, polycarbonate, polyester, and modified polyphenylene oxide.

The semiconductor chip G performs a repetitive operation as a switch. Accordingly, the housing 100 is subjected to stress attributable to a high temperature and a temperature change, but the engineering plastics is relatively stable with respect to a high temperature and a temperature change and is excellent in a heat dissipation characteristic compared to common plastics because the engineering plastics has excellent high temperature stability.

In an embodiment, the housing 100 may have been manufactured by applying a terminal made of aluminum or copper to the engineering plastic material through insert injection. The housing 100 made of the engineering plastic material discharges heat to the outside by propagating heat. The housing 100 may more increase thermal conductivity than a common engineering plastic material and may become light-weight and high heat dissipation engineering plastics, compared to aluminum by filling resin with a high heat conductivity filler.

Alternatively, the housing 100 may have a heat dissipation characteristic by coating a graphene heat dissipation coating material on the inside or outside of engineering plastics or high strength plastic material.

FIG. 5 is a perspective view illustrating a lower ceramic substrate according to an embodiment of the present disclosure.

As illustrated in FIGS. 3 and 5, the lower ceramic substrate 200 is attached to the upper surface of the heat sink 500. Specifically, the lower ceramic substrate 200 is disposed between the semiconductor chip G and the heat sink 500. The lower ceramic substrate 200 plays a role to deliver, to the heat sink 500, heat generated from the semiconductor chip G and to prevent a short by insulating the semiconductor chip G and the heat sink 500.

The lower ceramic substrate 200 may be soldered and bonded to the upper surface of the heat sink 500. The heat sink 500 is formed to have an area corresponding to the housing 100, and may be formed of a copper material in order to increase heat dissipation efficiency. SnAg, SnAgCu, etc. may be used as a solder for the soldering and bonding.

FIG. 6 is a diagram illustrating the upper surface and the lower surface of the lower ceramic substrate according to an embodiment of the present disclosure.

As illustrated in FIGS. 5 and 6, the lower ceramic substrate 200 includes a ceramic base 201 and metal layers 202 and 203 brazing-bonded to the upper surface and the lower surface of the ceramic base 201. In the lower ceramic substrate 200, the ceramic base 201 may have a thickness of 0.68 t, and each of the metal layers 202 and 203 formed at the upper surface and the lower surface of the ceramic base 201 may have a thickness of 0.8 t, for example.

The metal layer 202 at the upper surface 200a of the lower ceramic substrate 200 may be an electrode pattern on which a driving element is mounted. The driving element mounted on the lower ceramic substrate 200 may be an NTC temperature sensor 210. The NTC temperature sensor 210 is mounted on the upper surface of the lower ceramic substrate 200. The NTC temperature sensor 210 is for providing information on a temperature within the power module attributable to heat generated from the semiconductor chip G. The metal layer 203 at the lower surface 200b of the lower ceramic substrate 200 may be formed on the entire lower surface of the lower ceramic substrate 200 in order to facilitate the delivery of heat to the heat sink 500.

An insulating spacer 220 is bonded to the lower ceramic substrate 200. The insulating spacer 220 is bonded to the upper surface of the lower ceramic substrate 200, and defines an isolation distance between the lower ceramic substrate 200 and the upper ceramic substrate 300.

The insulating spacer 220 defines the isolation distance between the lower ceramic substrate 200 and the upper ceramic substrate 300, thereby increasing heat dissipation efficiency of heat generated from the semiconductor chip G mounted on the lower surface of the upper ceramic substrate 300 and preventing an electrical shock, such as a short, by preventing interference between the semiconductor chips G.

Multiple insulating spacers 220 are bonded at predetermined intervals by enclosing an edge at the upper surface of the lower ceramic substrate 200. An interval between the insulating spacers 220 is used as a space for increasing heat dissipation efficiency. In the drawing, the insulating spacers 220 are disposed to enclose the edge of the lower ceramic substrate 200. For example, eight insulating spacers 220 are disposed at regular intervals.

The insulating spacers 220 are integrally bonded to the lower ceramic substrate 200. The insulating spacers 220 may be applied for the purpose of checking the alignment of the upper ceramic substrate 300 when the upper ceramic substrate 300 is disposed over the lower ceramic substrate 200. In the state in which the insulating spacers 220 have been bonded to the lower ceramic substrate 200, when the upper ceramic substrate 300 on which the semiconductor chip G has been mounted is disposed over the lower ceramic substrate 200, the insulating spacers 220 may be applied for the purpose of checking the alignment of the upper ceramic substrate 300. Furthermore, the insulating spacers 220 contribute to preventing the bending of the lower ceramic substrate 200 and the upper ceramic substrate 300 by supporting the lower ceramic substrate 200 and the upper ceramic substrate 300.

The insulating spacers 220 may be formed of a ceramic material in order to insulate a chip mounted on the lower ceramic substrate 200 and a chip mounted on the upper ceramic substrate 300 and a part. For example, the insulating spacers may be formed of one kind selected among $Al_2O_3$, ZTA, $Si_3N_4$, and AlN or a mixed alloy of two or more of them. $Al_2O_3$, ZTA, $Si_3N_4$, and AlN are insulating materials having excellent mechanical strength and heat-resisting properties.

The insulating spacers 220 are brazing-bonded to the lower ceramic substrate 200. The insulating spacers 220 are brazing-bonded to the lower ceramic substrate 200 because the substrate may be broken due to thermal and mechanical shocks upon soldering or pressurization sintering if the insulating spacers 220 are soldered and bonded to the lower ceramic substrate 200. A brazing bonding layer including an AgCu layer and a Ti layer may be used for the brazing bonding. Heat treatment for the brazing may be performed at 780° C. to 900° C. After the brazing, the insulating spacers 220 are integrally formed with the metal layer 202 of the lower ceramic substrate 200. The thickness of the brazing bonding layer is 0.005 mm to 0.08 mm, which is thin to the extent that the height of the insulating spacers is not affected and has high bonding strength.

An interconnection spacer 230 is installed between the lower ceramic substrate 200 and the upper ceramic substrate 300. The interconnection spacer 230 may perform an electrical connection between electrode patterns instead of a connection pin in a substrate having an upper and lower duplex structure. The interconnection spacer 230 can increase bonding strength and improve electrical characteristics by directly connecting the substrates, while preventing an electrical loss and shot. The interconnection spacer 230 may have one end bonded to the electrode pattern of the lower ceramic substrate 200 by using a brazing bonding method. Furthermore, the interconnection spacer 230 may have the other end opposite to the one end bonded to the electrode pattern of the upper ceramic substrate 300 by using a brazing bonding method or a soldering bonding method. The interconnection spacer 230 may be a Cu or Cu+CuMo alloy.

FIG. 7 is a perspective view illustrating an upper ceramic substrate according to an embodiment of the present disclosure. FIG. 8 is a diagram illustrating the upper surface and the lower surface of the upper ceramic substrate according to an embodiment of the present disclosure.

As illustrated in FIGS. 7 and 8, the upper ceramic substrate 300 is disposed over the lower ceramic substrate 200.

The upper ceramic substrate 300 is an intermediate substrate having a stack structure. The upper ceramic substrate 300 has the semiconductor chip G mounted on a lower surface thereof and a high side circuit and a low side circuit for high-speed switching constructed on the lower surface.

The upper ceramic substrate 300 includes a ceramic base 301 and metal layers 302 and 303 brazing-bonded to the upper surface and the lower surface of the ceramic base 301. In the upper ceramic substrate 300, the ceramic base has a thickness of 0.38 t, and each of electrode patterns of the upper surface 300a and the lower surface 300b of the ceramic base has a thickness of 0.3 t, for example. The ceramic substrate is not twisted upon brazing only when the patterns at the upper surface and the lower surface thereof have the same thickness.

The electrode patterns that are formed by the metal layer 302 at the upper surface of the upper ceramic substrate 300 are divided into the first electrode pattern a, the second electrode pattern b, and the third electrode pattern c. The electrode patterns that are formed by the metal layer 303 at the lower surface of the upper ceramic substrate 300 correspond to the electrode patterns that are formed by the metal layer 302 at the upper surface of the upper ceramic substrate 300. Dividing the electrode patterns at the upper surface of the upper ceramic substrate 300 into the first electrode pattern a, the second electrode pattern b, and the third electrode pattern c is for division into a high side circuit and a low side circuit for high-speed switching.

The semiconductor chip G is provided at the lower surface 300b of the upper ceramic substrate 300 in a flip chip form by an adhesive layer, such as a solder or an Ag paste. As the semiconductor chip G is provided in the flip chip form at the lower surface of the upper ceramic substrate 300, an inductance value can be lowered as much as possible because wire bonding is omitted. Accordingly, heat dissipation performance can also be improved.

As illustrated in FIG. 8, the semiconductor chip G may be connected in parallel by two for high-speed switching. Two semiconductor chips G are disposed at a location at which the first electrode pattern a and the second electrode pattern b, among the electrode patterns of the upper ceramic substrate 300, are connected. The remaining two semiconductor chips G are disposed in parallel at a location at which the second electrode pattern b and the third electrode pattern c are connected. For example, the capacity of one semiconductor chip G is 150 A. Accordingly, the capacity of two semiconductor chips G become 300 A by connecting the two semiconductor chips G in parallel. The semiconductor chip G is a GaN chip.

The purpose of the power module using the semiconductor chip G is for high-speed switching. For the high-speed switching, it is important to connect the gate drive IC terminal and a gate terminal of the semiconductor chip G at a very short distance. Accordingly, a connection distance between the gate drive IC and the gate terminal is minimized by connecting the semiconductor chips G in parallel. Furthermore, in order for the semiconductor chip G to switch at high speed, it is important for the gate terminal and source terminal of the semiconductor chip G to maintain the same interval. To this end, the gate terminal and the source terminal may be disposed so that a connection pin is connected to the middle between the semiconductor chip G and the semiconductor chips G. A problem occurs if the gate terminal and the source terminal do not maintain the same interval or the length of a pattern is changed.

The gate terminal is a terminal that turns on/off the semiconductor chip G by using a low voltage. The gate terminal may be connected to the PCB substrate 400 through the connection pin. The source terminal is a terminal to and from which a high current is input and output. The semiconductor chip G includes a drain terminal. The source terminal and the drain terminal may change the directions of currents thereof by being divided into an N type and a P type. The source terminal and the drain terminal are responsible for the input and output of a current through the first electrode pattern a, the second electrode pattern b, and the third electrode pattern c, that is, the electrode patterns on which the semiconductor chip G is mounted. The source terminal and the drain terminal are connected to the first terminal 610 and the second terminal 620 in FIG. 1, which are responsible for the input and output of a power source.

Referring to FIGS. 1 and 8, the first terminal 610 illustrated in FIG. 1 includes a + terminal and a − terminal. A power source that is introduced into the + terminal of the first terminal 610 is output to the second terminal 620 through the first electrode pattern a of the upper ceramic substrate 300 illustrated in FIG. 8, the semiconductor chip G disposed between the first electrode pattern a and the second electrode pattern b, and the second electrode pattern b. Furthermore, a power source introduced into the second terminal 620 illustrated in FIG. 1 is output to the − terminal of the first terminal 610 through the second electrode pattern b illustrated in FIG. 8, the semiconductor chip G disposed between the second electrode pattern b and the third electrode pattern c, and the third electrode pattern c. For example, a power that is introduced from the first terminal 610 and output to the second terminal 620 through the semiconductor chip G becomes a high side. A power source that is introduced from the second terminal 620 and output to the first terminal 610 through the semiconductor chip G becomes a low side.

As illustrated in FIG. 7, the upper ceramic substrate 300 may have a cutting part 310 formed at a portion corresponding to the NTC temperature sensor 210. The NTC temperature sensor 210 is mounted on the upper surface of the lower ceramic substrate 200. The NTC temperature sensor 210 is for providing information on a temperature within the power module, which is attributable to heat generated from the semiconductor chip G. However, interference occurs between the NTC temperature sensor 210 and the upper ceramic substrate 300 because the thickness of the NTC temperature sensor 210 is greater than an interval between the lower ceramic substrate 200 and the upper ceramic substrate 300. In order to solve such a problem, the cutting part 310 is formed by cutting a portion of the upper ceramic substrate 300 that interferes with the NTC temperature sensor 210.

A silicon fluid or epoxy for molding may be injected into the space between the upper ceramic substrate 300 and the lower ceramic substrate 200 through the cutting part 310. In order to insulate the upper ceramic substrate 300 and the lower ceramic substrate 200, the silicon fluid or the epoxy needs to be injected. In order to inject the silicon fluid or the epoxy into the upper ceramic substrate 300 and the lower ceramic substrate 200, the cutting part 310 may be formed by cutting one surface of the upper ceramic substrate 300. The cutting part 310 is formed at a location corresponding to the NTC temperature sensor 210, and can also prevent interference between the upper ceramic substrate 300 and the NTC temperature sensor 210. The silicon fluid or the epoxy may be filled into the space between the lower ceramic substrate 200 and the upper ceramic substrate 300 and the space between the upper ceramic substrate 300 and the PCB substrate 400 for the purposes of protecting the semiconductor chip G, reducing vibration, and insulation.

A through hole 320 is formed in the upper ceramic substrate 300. The through hole 320 is for connecting the semiconductor chip G mounted on the upper ceramic substrate 300 and a driving element mounted on the PCB substrate 400 at the shortest distance and connecting the NTC temperature sensor 210 mounted on the lower ceramic substrate 200 and a driving element mounted on the PCB substrate 400 at the shortest distance in an upper and lower duplex substrate structure.

Eight through holes 320 are formed at locations at which the semiconductor chip is installed by two. Two through holes 320 are installed at a location at which the NTC temperature sensor is installed. A total of ten through holes 320 may be formed. Furthermore, multiple through holes 320 may be formed at portions of the upper ceramic substrate 300 in which the first electrode pattern a and the third electrode pattern c have been formed.

The multiple through holes 320 formed in the first electrode pattern a enable a current that is introduced into the first electrode pattern a at the upper surface of the upper ceramic substrate 300 to move to the first electrode pattern a formed at the lower surface of the upper ceramic substrate 300 and to be introduced into the semiconductor chip G. The multiple through holes 320 formed in the third electrode pattern c enable a current that is introduced into the semiconductor chip G to move to the third electrode pattern c at the upper surface of the upper ceramic substrate 300 through the third electrode pattern c at the lower surface of the upper ceramic substrate 300.

The diameter of the through hole 320 may be 0.5 mm to 5.0 mm. A connection pin is installed in the through hole 320, and is connected to the electrode pattern of the PCB substrate, which may be connected to a driving element mounted on the PCB substrate 400 through the through hole 320. In the upper and lower duplex substrate structure, the connection between the electrode patterns through the through hole 320 and the connection pin installed in the through hole 320 can contribute to improving restrictions according to the size of the power module by removing various output losses through the shortest distance connection.

A plurality of via holes 330 may be formed in the electrode pattern of the upper ceramic substrate 300. The via holes 330 may be processed to be at least 50% or more compared to the area of the substrate. It has been described that the area of the via holes 330 is applied as being at least 50% or more compared to the area of the substrate, for example, but the present disclosure is not limited thereto and the area of the via holes 330 may be processed to be 50% or less compared to the area of the substrate.

For example, 152 via holes may be formed in the first electrode pattern a, 207 via holes may be formed in the second electrode pattern b, and 154 via holes may be formed in the third electrode pattern c. The plurality of via holes 330 formed in each of the electrode patterns is for high current electrification and a high current distribution. If the electrode pattern at the upper surface of the upper ceramic substrate 300 and the electrode pattern at the lower surface of the upper ceramic substrate 300 become conductive to each other in one slot form, a problem, such as a short or overheating, may occur because a high current flows into only one side.

The via hole 330 is filled with a conductive substance. The conductive substance may be Ag or an Ag alloy. The Ag alloy may be an Ag—Pd paste. The conductive substance that is filled into the via hole 330 electrically connects the electrode pattern at the upper surface of the upper ceramic substrate 300 and the electrode pattern at the lower surface of the upper ceramic substrate 300. The via hole 330 may be formed by laser processing. The via hole 330 may be seen in the enlarged view of FIG. 8.

FIG. 9 is a plan view of a PCB substrate according to an embodiment of the present disclosure.

As illustrated in FIG. 9, a driving element for switching the semiconductor chip G or switching a GaN chip (a semiconductor chip) by using information detected by the NTC temperature sensor (reference numeral 210 in FIG. 7) is mounted on the PCB substrate 400. The driving element includes a gate drive IC.

A capacitor 410 is mounted on the upper surface of the PCB substrate 400. The capacitor 410 is mounted on the upper surface of the PCB substrate 400, that is, a location between the semiconductor chip G disposed to connect the first electrode pattern a and second electrode pattern b of the upper ceramic substrate 300 and the semiconductor chips G is disposed to connect the second electrode pattern b and third electrode pattern c of the upper ceramic substrate 300.

When the capacitor 410 is mounted on the upper surface of the PCB substrate 400, that is, the location between the semiconductor chips G, it is more advantageous in high-speed switching because the semiconductor chip G and a drive IC circuit can be connected at the shortest distance by using a connection pin (reference numeral 900 in FIG. 10). For example, ten capacitors 410 may be connected in parallel in order to satisfy the capacity thereof. In order to secure 2.5 µF or more for a decoupling use at the input stage of the capacitors, the capacity needs to be secured by connecting ten high-voltage capacitors. A relation equation is checked in 56 µF/630V×5 ea=2.8 µF. The gate drive IC circuit includes a high side gate drive IC and a low side gate drive IC.

FIG. 10 is a perspective view illustrating the state in which pin connections have been coupled to the upper ceramic substrate according to an embodiment of the present disclosure.

As illustrated in FIG. 10, the power module 10 includes a connection pin 910 for performing an electrical connection between electrode patterns.

The connection pin 910 is installed in the upper ceramic substrate 300.

The connection pin 910 may connect the gate terminal on which the semiconductor chip G is mounted and the electrode pattern on which the driving element is mounted by being inserted into the through hole formed in the upper ceramic substrate 300 and the PCB substrate 400. Alternatively, the connection pin 910 may connect the terminal of the NTC temperature sensor and the electrode pattern on which the driving element is mounted by being inserted into the through holes formed in the lower ceramic substrate 200, the upper ceramic substrate 300, and the PCB substrate 400. Alternatively, the connection pin 910 may connect the electrode pattern on which the semiconductor chip G is mounted and the electrode pattern on which the capacitor is mounted by being inserted into the through holes formed in the upper ceramic substrate 300 and the PCB substrate 400.

The connection pin 910 removes various output losses and enables high-speed switching by connecting the GaN chip mounted on the upper ceramic substrate 300 and a driving element mounted on the PCB substrate at the shortest distance.

FIG. 11 is a perspective view illustrating a bundle type connection pin according to an embodiment of the present disclosure.

As illustrated in FIGS. 10 and 11, in order to maintain the verticality of connection pins, a plurality of connection pins 910 may be manufactured into a bundle type connection pin 900 by interconnecting the connection pins 910. The connection pin 910 may be manufactured in a 2×2 pin, 2×1 pin, or 4×1 pin form. Each connection pin 910 is a cylindrical shape, and may have a shape in which a circular wing part 911 is formed on an outer circumference thereof. The connection pin 910 having the cylindrical shape may be inserted and soldered and bonded to the through hole (reference numeral 320 in FIG. 7).

The bundle type connection pin 900 may be formed by having a plastic structure 920 subjected to insert injection with the plurality of connection pins 910. In the isolation electrode structure of the power module, the connection pin 910 that connects isolated electrodes is multiple. Accordingly, in a structure that interconnects the multiple connection pins 910, if the connection pins 910 are manufactured into the bundle type connection pin 900, operation reliability of the power module 10 can be increased by increasing location accuracy and assembly convenience of the connection pins 910.

FIG. 12 is a diagram of a cross section A-A in FIG. 11.

As illustrated in FIG. 12, the bundle type connection pin 900 may be manufactured by matching the plastic structure 920 with the multiple connection pins 910 in shape or by having the plastic structure 920 subjected to insert injection with the multiple connection pins 910. In the bundle type connection pin 900, a part of the wing part 911 of each connection pin 910 protrudes from the lower surface of the plastic structure 920 and facilitates an electrical connection with an electrode pattern. The connection pin 910 may be formed of copper or a copper alloy material so that the electrical connection is facilitated.

FIG. 13 is a cross-sectional view illustrating a form in which the bundle type connection pin in FIG. 12 has been coupled to the upper ceramic substrate.

As illustrated in FIG. 13, the bundle type connection pin 900 may be inserted into the through hole 320 of the upper ceramic substrate 300, and may be soldered and bonded to an edge of the through hole 320. The soldering and bonding may be performed by using a method of melting a solder by applying a laser upon soldering. For example, the connection pin 910 may be fixed to the through hole 320 in a way to form the through hole 320 by radiating a laser to the upper ceramic substrate 300, to fit and couple the bundle type connection pin 910 on which a solder paste has been coated to each through hole 320, and then to melt the solder paste by locally heating the connection pin 910 by using a laser.

The laser welding may be a method of the metal layer of the upper ceramic substrate 300 being melted and bonded to the connection pin 910 in a way to heat the connection pin 910 by radiating a laser to the top of the connection pin 910. Alternatively, the laser welding may include heat the connection pin 910 by radiating a laser to the wing part of the connection pin 910. In the bundle type connection pin 900, a part of the wing part 911 of the connection pin 910 may be exposed to the upper surface of the plastic structure 920, and thus a laser may be radiated to the wing part 911 of the connection pin 910.

Referring to FIGS. 8, 10, and 11, among the bundle type connection pins 900, the 2×2 pin form is coupled to the through holes 320 formed at locations at which the semiconductor chip G is installed, the 2×1 pin form is coupled to the through holes 320 formed at locations at which the NTC temperature sensor 210 is installed, and the 4×1 pin form is coupled to the through holes 320 formed in the first electrode pattern a and the third electrode pattern c. The locations of the through holes 320 may be seen in FIGS. 7 and 8. The bundle type connection pin 900 has advantages in that it increases process convenience in coupling the connection pins 910 to the through holes 320 and increases location accuracy.

FIGS. 14 and 14B are perspective views illustrating modified examples of the bundle type connection pin according to an embodiment of the present disclosure.

As illustrated in FIG. 14, the connection pin 910 may be formed in a cylindrical shape not having a wing part. In this case, multiple connection pins 910 each having a cylindrical shape may be manufactured into a bundle type connection pin 900a by matching the multiple connection pins 910 with the plastic structure 920 in shape or having the multiple connection pins 910 subjected to insert injection with the plastic structure 920.

As illustrated in FIG. 15, the connection pins 910 may further include respective exposed metal parts 911a that protrude from the upper surface and the lower surface of the plastic structure 920. If there is a difficulty in fixing the connection pins 910 to the substrate by individually standing the connection pins 910 because the sizes and number of connection pins 910 are small and many, the connection pins 910 may be perpendicularly aligned by making two or more connection pins 910 into a connection pin array through insert injection.

The bundle type connection pin (reference numerals 900 and 900a in FIG. 11) made into the 2×1 pin form, the 2×2 pin form, or the 4×1 pin form and the bundle type connection pin 900b made into the connection pin array can increase assembly efficiency because a regular interval is maintained between the connection pins 910 and verticality and an alignment degree between the connection pins 910 and the through holes 320 are high.

The bundle type connection pin 900b made into the connection pin array illustrated in FIG. 15 may bond the connection pins 910 to an edge of the through holes 320 in a way to heat the connection pins 910 by radiating a laser to the exposed metal parts 901 and 911a that protrude from the upper surface and the lower surface of the plastic structure 920.

The bundle type connection pin 900, 900a, 900b increases convenience of the assembly and location accuracy of the multiple connection pins 910 because the connection pins 910 are interconnected and coupled to the through holes 320. That is, since the connection pins 910 are manufactured in a bundle form in a way to correspond to the plurality of through holes 320 and coupled to the plurality of through holes 320 at a time, location accuracy of the connection pin 910 can be increased and convenience of the assembly thereof can be increased.

FIG. 16 is a perspective view illustrating the state in which connection pins have been coupled to an upper ceramic substrate according to another embodiment of the present disclosure.

As illustrated in FIG. 16, a connection pin 800 may be inserted into the through hole (reference numeral 420 in FIG. 9) formed in the upper ceramic substrate 300 and the PCB substrate 400, and may connect the gate terminal on which the semiconductor chip G is mounted and the electrode pattern on which the driving element is mounted.

Alternatively, the connection pin 800 may be inserted into the through hole 320, 420 that is formed in the lower ceramic substrate 200, the upper ceramic substrate 300, and the PCB substrate 400, and may connect the terminal of the NTC temperature sensor (reference numeral 210 in FIG. 7) and the electrode pattern that connects a driving element.

Alternatively, the connection pin 800 may be inserted into the through hole 320, 420 that is formed in the upper ceramic substrate 300 and the PCB substrate 400, and may connect the electrode pattern on which the semiconductor chip G is mounted and the electrode pattern on which the capacitor (reference numeral 410 in FIG. 9) is mounted.

The connection pin 800 removes various output losses and enables high-speed switching by connecting the GaN chip mounted on the upper ceramic substrate 300 to the driving element mounted on the PCB substrate 400 at the shortest distance.

The connection pin 800 is installed in the upper ceramic substrate 300. Specifically, the connection pins 800 are fit and coupled to the through hole 320 formed at the location at which the GaN chip is installed, the through hole 320 formed at the location at which the NTC temperature sensor 210 is installed, and the through holes 320 formed in the first electrode pattern a and the third electrode pattern c, respectively, in the upper ceramic substrate 300.

Referring to FIGS. 1, 8, and 16, the connection pin 800 fit and coupled to the through hole 320 formed at the location at which the semiconductor chip G is installed connects the gate terminal of the semiconductor chip G to the electrode pattern of the PCB substrate 400. The connection pin 800 fit and coupled to the through hole 320 formed at the location at which the NTC temperature sensor 210 is installed connects the NTC temperature sensor 210 to the electrode pattern of the PCB substrate 400. The connection pins 800 fit and coupled to the through holes 320 formed in the first electrode pattern a and the third electrode pattern c, respectively, connect the first electrode pattern a and the third electrode pattern c to the electrode patterns of the PCB substrate 400.

FIG. 17 is a perspective view illustrating a connection pin according to another embodiment of the present disclosure.

As illustrated in FIG. 17, the connection pin 800 includes a pin body 801 formed in a quadrangle column shape having a predetermined height and wings 802 formed at both sides of the pin body 801 and each having a quadrangle shape. A top 803 of the connection pin 800 is formed in a quadrangle pyramid shape. The quadrangle pyramid shape is for enabling a top portion of the connection pin 800 to be easily inserted into the through hole 320 of the substrate that is coupled from the upper side thereof.

The shape of the connection pin 800 may be mass-produced through a blanking process.

FIG. 18 is a plan view and side cross-sectional view illustrating a method of a connection pin according to another embodiment of the present disclosure.

As illustrated in FIG. 18, a plurality of connection pins 800 may be manufactured at a time by forming, in a metal plate 800a having a predetermined thickness, pressurization parts 803a the upper surface and the lower surface of each of which have been rolled in a way to correspond to the quadrangle pyramid shapes of the tops of the connection pins 800 and blanking the metal plate 800a in which the pressurization parts 803a have been formed from the upper side thereof. If the metal plate 800a in which the pressurization parts 803a each corresponding to the upper surface and the lower surface of the top 803 of the connection pin 800 have been formed is blanked in a lateral shape including the connection pin 800 of the wing 802, the plurality of connection pins 800 may be manufactured at a time.

The thickness of the metal plate 800a corresponds to an inner diameter of the through hole 320 of the upper ceramic substrate 300. For example, the metal plate 800a having a predetermined thickness is prepared so that the length of a diagonal line of a cross section of the connection pin 800 may correspond to the inner diameter of the through hole 320 of the upper ceramic substrate 300.

Since the aforementioned shape of the connection pin 800 may be manufactured by only a blanking process, a manufacturing unit price can be reduced by applying such manufacturing to the power module 10 using the ceramic substrate. The metal plate 800a may be formed of copper or a copper alloy material.

FIG. 19 is a cross-sectional view illustrating a form in which the connection pins in FIG. 17 has been coupled to the upper ceramic substrate.

As illustrated in FIG. 19, the connection pin 800 may be fit and coupled to the through hole 320 of the upper ceramic substrate 300, and may be soldered and bonded to an edge of the through hole 320.

The soldering and bonding may be performed by using a method of melting a solder by applying a laser upon soldering. For example, the connection pin 800 may be fixed to the through hole 320 in a way to form the through hole 320 by radiating a laser to the upper ceramic substrate 300, to fit and couple the connection pin 800 on which a solder paste has been coated to each through hole 320, and to melt the solder by locally heating the connection pin 800 by using a laser.

The laser welding may be a method of the metal layer of the upper ceramic substrate 300 being melted and bonded to the connection pin 800 in a way to heat the connection pin 800 by radiating a laser to the top of the connection pin 800. Alternatively, the laser welding may include heating the connection pin 800 by radiating a laser to the wing 802 of the connection pin 800.

The length of a diagonal line of a cross section of the pin body 801 of the connection pin 800 may correspond to an inner diameter of the through hole 320. This is for protecting the connection pin 800 so that the connection pin 800 is fit and coupled to the through hole 320. Alternatively, the through hole 320 may be a shape corresponding to a shape of a cross section of the connection pin 800 so that the connection pin 800 is fit and coupled to the through hole 320.

The present disclosure can reduce a manufacturing unit price and increase work convenience in a process of manufacturing the power module because the connection pin coupled to the through hole is formed in a shape capable of mass production and the mass production is made possible through a blanking process.

FIG. 20 is a perspective view illustrating the state in which a connection pin has been coupled to the upper ceramic substrate according to still another embodiment of the present disclosure.

As illustrated in FIG. 20, a connection pin 900 is inserted into the through hole 320 formed at a location adjacent to the semiconductor chip G in the upper ceramic substrate 300. The connection pin 900 inserted into the through hole 320 formed at the location adjacent to the semiconductor chip G may be inserted into the through hole 420 formed at a location corresponding to the PCB substrate (reference numeral 400 in FIG. 9), and may connect the gate terminal on which the semiconductor chip G is mounted and the electrode pattern of the PCB substrate 400.

Furthermore, the connection pin 900 is inserted into the through hole 320 formed at a location adjacent to the NTC temperature sensor (reference numeral 210 in FIG. 7) in the upper ceramic substrate 300. The connection pin 800 inserted into the through hole 320 formed at the location adjacent to the NTC temperature sensor may be inserted into the through hole 420 formed at a location corresponding to the PCB substrate 400, and may connect the terminal of the NTC temperature sensor 210 and the electrode pattern of the PCB substrate 400.

Furthermore, the connection pins 900 are inserted into multiple through holes 320 that are formed in the first electrode pattern a and the third electrode pattern c in a row in the upper ceramic substrate 300. The connection pins 800 inserted into the multiple through holes 320 that are formed in the first electrode pattern a and the third electrode pattern c may be inserted into the through holes 420 formed at locations corresponding to the PCB substrate 400, and may connect the semiconductor chip G to the capacitor 410 of the PCB substrate 400.

The connection pin 900 removes various output losses and enables high-speed switching by connecting the semiconductor chip G mounted on the upper ceramic substrate 300 to a driving element mounted on the PCB substrate 400 at the shortest distance.

FIG. 21 is a diagram illustrating the state in which the connection pin has been coupled to the through hole as still another embodiment of the present disclosure.

As illustrated in FIG. 21, the connection pin 900 is installed in the through hole 320 formed in the upper ceramic substrate 300.

The upper ceramic substrate 300 includes the ceramic base 301 and the metal layers 302 and 303 formed at the upper surface and the lower surface of the ceramic base 301. The through hole 320 is formed to penetrate the metal layers 302 and 303 and ceramic base 301 of the upper ceramic substrate 300. The connection pin 900 is fit and coupled to the through hole 320. The connection pin 900 fit and coupled to the through hole 320 is bonded to the metal layer 302 at the upper surface of the upper ceramic substrate 300 and the PCB substrate 400 by laser welding.

The connection pin 900 may include a pin body 910 that is formed in a circular column or quadrangle column shape and a wing part 911 formed on the outer circumference of the pin body 910 or both sides thereof in a way to protrude and that is seated in the metal layer 302 at the edge of the through hole 320.

In an embodiment, the pin body 910 of the connection pin 900 is formed in a circular column shape, and the circular wing part 911 is formed on the outer circumference of the pin body 910. The wing part 911 is supported and bonded to the edge of the through hole 320, so that the connection pin 800 is stably fixed to the through hole 320.

Furthermore, multiple connection pins 900 are manufactured in a bundle form by being matched with the plastic structure 920 in shape and being subjected to insert injection with the plastic structure 920. If the connection pins 900 are manufactured in a bundle form, operation reliability of the power module can be improved by increasing location accuracy and assembly convenience of the connection pins 900. The bundle type connection pin 900 can increase assembly efficiency because a regular interval is maintained between the connection pins 900 and verticality and an alignment degree between the connection pin 900 and the through hole 320 are high.

In the bundle type connection pin 900, a part of the wing part 911 of each connection pin 900 may protrude from the lower surface of the plastic structure 820, thereby facilitating an electrical connection with the metal layer 302 at the upper surface of the upper ceramic substrate 300.

If the connection pin 900 is fixed by forming the through hole 320 in the upper ceramic substrate 300, the fixing of the connection pin 900 is easy, and the precision of a location thereof is improved. It is preferred that the through hole 320 corresponds to an outer diameter of the connection pin 900 in order to facilitate the fitting and coupling of the connection pin 900.

The connection pin 900 is formed of copper or a copper alloy material. The metal layers 302 and 303 of the upper ceramic substrate 300 are formed of copper or a copper alloy material. The copper and the copper alloy facilitate an electrical connection between electrical parts.

The connection pin 900 fit and coupled to the through hole 320 of the upper ceramic substrate 300 are bonded to the metal layer 302 at the upper surface of the upper ceramic substrate 300 and the PCB substrate 400 by using a laser welding method. Specifically, the connection pin 900 is bonded to the PCB substrate 400 by using the laser welding method through the medium of the metal layer 302 at the upper surface of the upper ceramic substrate 300 and the solder layer 850.

The solder layer 850 is disposed between the metal layer 302 at the edge of the through hole 320 and the connection pin 900, and bonds the connection pin 900 to the upper ceramic substrate 300. When the solder layer 850 is welded to the PCB substrate 400 by a laser, a solder coated between the connection pin 900 and the upper ceramic substrate 300 is melted, and bonds the connection pin 900 and the upper ceramic substrate 300 together. The laser welding may be performed by using a method of melting the solder coated between the connection pin 900 and the upper ceramic substrate 300 in a way to heat the connection pin 900 by radiating a laser to the connection pin 900.

Alternatively, the connection pin 900 may be bonded to the metal layer 302 at the upper surface of the upper ceramic substrate 300 by using only a laser welding method without a solder. In this case, the laser welding may be a method of the metal layer 302 of the upper ceramic substrate 300 being melted and bonded to the connection pin 900 in a way to heat the connection pin 900 by radiating a laser to the connection pin 900. The laser welding may be effective when the connection pin 900 is heated by radiating a laser to the wing part 911 of the connection pin 900 having a relatively wide area.

FIG. 22 is a diagram for describing a process of fixing the connection pin to the through hole as still another embodiment of the present disclosure.

As illustrated in FIG. 22, in a method of manufacturing the power module, a process of fixing the connection pin to the through hole includes a step of preparing the upper ceramic substrate 300 including the ceramic base 301 and the metal layers 302 and 303 at the upper surface and the lower surface of the ceramic base 301 and forming the through hole 320 so that the through hole 320 penetrates the metal layers 302 and 303 and ceramic base 301 of the upper ceramic substrate 300, a step of fitting and coupling the connection pin 900 to the through hole 320, and a step of bonding the connection pin 900 to the metal layer 302 at the upper surface of the upper ceramic substrate 300 by radiating a laser to the connection pin 900 fit and coupled to the through hole 320.

In the step of forming the through hole, the through hole 320 may be formed by radiating a laser to the upper ceramic substrate 300. If the through hole 320 is formed by radiating a laser, a dimensional tolerance is minimized, and verticality is high.

In the step of fitting and coupling the connection pin to the through hole, the wing part 911 of the connection pin 900 is seated in an edge of the through hole 320.

Before the step of fitting and coupling the connection pin to the through hole, a step of coating a solder on the through hole 320 and the edge of the through hole 320 may be further included. The solder may be SnAg, SnAgCu, etc.

In the bonding step, the connection pin 900 may be fixed to the through hole 320 in a way to melt the solder by locally heating the connection pin 900 by using a laser. The laser may heat the connection pin 900 at a temperature of 700° C. or more to 800° C. or less by being radiated to the top of the connection pin or the wing part 911. A temperature at which the connection pin 900 is heated is a temperature range in which soldering is possible. When the connection pin 900 is heated, the solder and the metal layer 302 of the upper ceramic substrate 300 are melted, so that the connection pin 900 is bonded to the upper ceramic substrate 300.

FIG. 23 is a partial cross-sectional view illustrating the state in which the connection pin has been fixed to the through hole of the upper ceramic substrate and the PCB substrate has been installed on the connection pin as still another embodiment of the present disclosure.

As illustrated in FIG. 23, the connection pin 900 fixed to the through hole 320 of the upper ceramic substrate 300 is fit and coupled to the through hole 420 of the PCB substrate 400 installed thereon, and electrically connects electrical parts of the upper ceramic substrate 300 and the PCB substrate 400.

Specifically, the connection pin 900 is fit and coupled to the through hole 420 of the PCB substrate 400, which has a lower side fit and coupled to the through hole 320 of the upper ceramic substrate 300 and is fixed by laser welding and has an upper side disposed over the upper ceramic substrate 300.

For example, the connection pin 900 is coupled to the through hole 320 of the upper ceramic substrate 300 and the through hole 420 of the PCB substrate 400 through the through hole 320 and the through hole 420, and connects a gate electrode of the semiconductor chip G mounted on the lower surface of the upper ceramic substrate 300 to the electrode pattern on which a driving element of the PCB substrate 400 is mounted. The driving element includes the gate drive IC.

The connection pin 900 connects the metal layer 302 of the upper ceramic substrate 300 and the electrode pattern of the PCB substrate 400 at the shortest distance in order to be more advantageous for high-speed switching. The connection pin 900 electrically connects the upper ceramic substrate 300 and the PCB substrate 400. The PCB substrate 400 may have a multi-layer structure in which an internal electrode pattern is formed between a plurality of insulating layers and an upper electrode pattern is formed on the highest layer thereof.

Meanwhile, the connection pin 900 connects the upper ceramic substrate 300 and the PCB substrate 400, but does not come into contact with the lower ceramic substrate 200 that is disposed under the upper ceramic substrate 300 in order to prevent a short.

The lower ceramic substrate 200 is spaced apart from the upper ceramic substrate 300 at a predetermined interval and disposed thereunder, so that a space for heat dissipation can be secured between the upper ceramic substrate 300 and the lower ceramic substrate 200 and heat generated from the semiconductor chip G can be efficiently discharged.

The heat sink 500 is attached to the lower surface of the lower ceramic substrate 200, so that heat that is generated from the semiconductor chip G and that is delivered to the lower ceramic substrate 200 can be easily discharged to the outside through the heat sink 500.

The semiconductor chip G is mounted on the lower surface of the upper ceramic substrate 300 in a flip chip form by using a solder. Furthermore, the heat sink 500 bonded to the lower surface of the lower ceramic substrate 200 is formed of a copper or copper alloy material, so that heat delivered to the lower ceramic substrate 200 is easily discharged to the outside.

The aforementioned embodiment of the present disclosure facilitates the fixing of the connection pin and improves the precision of a location thereof by forming the through hole in the ceramic substrate. Furthermore, the work of fixing the connection pin to the ceramic substrate is easy because after a solder is coated between the connection pin and the ceramic substrate, the solder is melted and bonded by locally heating the solder by using a laser.

Optimum embodiments of the present disclosure have been disclosed in the drawings and specification. Specific terms have been used in the present specification, but the terms are used to only describe the present disclosure, not to limit the meaning of the terms or the scope of right of the present disclosure written in the claims. Accordingly, a person having ordinary knowledge in the art will understand that various modifications and other equivalent embodiments are possible from the embodiments. Accordingly, the true technical range of right of the present disclosure should be determined by the claims below.

The invention claimed is:

1. A power module comprising:
a ceramic substrate comprising a ceramic base and electrode patterns formed at an upper surface and a lower surface of the ceramic base;
a PCB substrate disposed over the ceramic substrate and comprising an electrode pattern;
a plurality of through holes formed in at least one of the ceramic substrate and the PCB substrate; and
a connection pin coupled to the through hole and connecting the electrode patterns of the ceramic substrate and the electrode pattern of the PCB substrate,
wherein the connection pin is a bundle type connection pin in which a plurality of connection pins is interconnected at regular intervals,
wherein the bundle type connection pin comprises:
a plurality of connection pins each having a cylindrical shape and having a circular wing part formed on an outer circumference thereof; and
a plastic structure matched with the plurality of connection pins in shape or subjected to insert injection with the plurality of connection pins so that the plurality of connection pins is spaced apart from each other in a way to correspond to an interval between the through holes.

2. The power module of claim 1, wherein:
the bundle type connection pin has the plastic structure matched with the wing part in shape or has the plastic structure subjected to insert injection with the wing part, and
a part of the wing part protrudes from a lower surface of the plastic structure.

3. The power module of claim 1, wherein the connection pin is a bundle type connection pin having a 2×2 pin or 2×1 pin or 4×1 pin structure or a bundle type connection pin having a structure in which the plurality of connection pins is aligned in a row.

4. The power module of claim 1, wherein the connection pin is fit and coupled to the through hole and is soldered and bonded to an edge of the through hole.

5. The power module of claim 1, wherein the connection pin is formed of copper or a copper alloy.

6. The power module of claim 1, wherein the connection pin is fit and coupled to the through hole and is bonded to a metal layer forming the electrode pattern of the ceramic substrate by laser welding.

7. The power module of claim 6, further comprising a solder layer disposed and bonded between the metal layer at the edge of the through hole and the connection pin.

8. The power module of claim 6, wherein the connection pin and the metal layer are formed of copper or a copper alloy.

9. A power module comprising:
a ceramic substrate comprising a ceramic base and electrode patterns formed at an upper surface and a lower surface of the ceramic base;
a PCB substrate disposed over the ceramic substrate and comprising an electrode pattern;
a plurality of through holes formed in at least one of the ceramic substrate and the PCB substrate; and
a connection pin coupled to the through hole and connecting the electrode patterns of the ceramic substrate and the electrode pattern of the PCB substrate,
wherein the connection pin comprises:
a pin body formed in a quadrangle column shape; and
wings formed on both sides of the pin body in a way to protrude and each having a quadrangle shape, wherein the connection pin is formed by blanking a metal plate, wherein a top of the connection pin is formed in a quadrangle pyramid shape, and the metal plate has a shape comprising pressurization parts formed at an upper surface and a lower surface thereof by pressurizing the metal plate in a way to correspond to the quadrangle pyramid shape.

10. The power module of claim 9, wherein a length of a diagonal line of a cross section of the pin body of the connection pin corresponds to an inner diameter of the through hole.

11. The power module of claim 9, wherein the through hole has a shape corresponding to a shape of a cross section of the connection pin.

12. The power module of claim 9, wherein:

the pin body of the connection pin is fit and coupled to the through hole, and the wings of the connection pin are soldered and bonded to an edge of the through hole.

* * * * *